United States Patent [19]

Warner, Jr. et al.

[11] Patent Number: 5,089,862
[45] Date of Patent: Feb. 18, 1992

[54] MONOCRYSTALLINE THREE-DIMENSIONAL INTEGRATED CIRCUIT

[76] Inventors: Raymond M. Warner, Jr., 6136 Sherman Cir., Edina, Minn. 55436; Ronald D. Schrimpf, 5053 W. Blackbrd Dr., Tucson, Ariz. 85741; Alfons Tuszynski, 12585 Pacato Cir. North, San Diego, Calif. 92128

[21] Appl. No.: 443,175

[22] Filed: Nov. 30, 1989

Related U.S. Application Data

[63] Continuation-in-part of Ser. No. 861,708, May 12, 1986, Pat. No. 4,885,615, which is a continuation-in-part of Ser. No. 799,652, Nov. 19, 1985, Pat. No. 4,794,443.

[51] Int. Cl.$^5$ .............. H01L 27/01; H01L 29/68; H01L 29/78; H01L 27/14
[52] U.S. Cl. .................. 357/23.1; 357/23.2; 357/23.5; 357/24; 357/51; 357/30; 357/58
[58] Field of Search .............. 357/23.5, 23.2, 24, 357/51, 30, 357

[56] References Cited

U.S. PATENT DOCUMENTS

| | | | |
|---|---|---|---|
| 4,412,239 | 10/1983 | Iwasaki et al. | 357/92 |
| 4,500,905 | 2/1985 | Shibata | 357/41 |
| 4,638,344 | 1/1987 | Cardwell, Jr. | 357/41 |

*Primary Examiner*—Rolf Hille
*Assistant Examiner*—Robert P. Limanek
*Attorney, Agent, or Firm*—Hugh D. Jaeger

[57] ABSTRACT

A monocrystalline monolith contains a 3-D array of interconnected lattice-matched devices (which may be of one kind exclusively, or that kind in combination with one or more other kinds) performing digital, analog, image-processing, or neural-network functions, singly or in combination. Localized inclusions of lattice-matched metal and (or) insulator can exist in the monolith, but monolith-wide layers of insulator are avoided. The devices may be self-isolated, junction-isolated, or insulator-isolated, and may include but not be limited to MOSFETs, BJTs, JFETs, MFETs, CCDs, resistors, and capacitors. The monolith is fabricated in a single apparatus using a process such as MBE or sputter epitaxy executed in a continuous or quasicontinuous manner under automatic control, and supplanting hundreds of discrete steps with handling and storage steps interpolated. "Writing" on the growing crystal is done during crystal growth by methods that may include but not be limited to ion beams, laser beams, patterned light exposures, and physical masks. The interior volume of the fabrication apparatus is far cleaner and more highly controlled than that of a clean room. The apparatus is highly replicated and is amenable to mass production. The product has unprecedented volumetric function density, and high performance stems from short signal paths, low parasitic loading, and 3-D architecture. High reliability stems from contamination-free fabrication, small signal-arrival skew, and generous noise margins. Economy stems from mass-produced factory apparatus, automatic IC manufacture, and high IC yield. Among the IC products are fast and efficient memories with equally fast and efficient error-correction abilities, crosstalk-free operational amplifiers, and highly paralleled and copiously interconnected neural networks.

49 Claims, 25 Drawing Sheets

MONOCRYSTALLINE THREE-DIMENSIONAL INTEGRATED CIRCUIT

CROSS REFERENCES TO CO-PENDING APPLICATIONS

This patent application is a continuation-in-part of U.S. Ser. No. 861,708, filed May 12, 1986, entitled "Monocrystalline Three-Dimensional Integrated Circuit," to be issued on Dec. 5, 1989, as U.S. Pat. No. 4,885,615, which is itself a continuation-in-part of U.S. Ser. No. 799,652, filed Nov. 19, 1985, entitled "All-Semiconductor Three-Dimensional Integrated Circuit," which issued on Dec. 27, 1988, as U.S. Pat. No. 4,794,443.

FIELD OF THE INVENTION

The present invention pertains to monocrystalline three-dimensional integrated devices, and more particularly, pertains to devices containing a 3-D doping pattern forming varied devices and circuits that may be junction-isolated and with interconnecting signal paths and power buses, that also may be junction-isolated, and that may have tunnel junctions connecting N-type to P-type regions.

The present invention also pertains to use of a thin monocrystalline lattice-matched silicide layer as an ohmic contact and/or a thicker such silicide region as a conductor. The monocrystalline devices can also be surrounded by an insulator.

The present invention further constitutes a qualitatively and quantitatively new kind of integrated circuit (IC), an improved monocrystalline three-dimensional integrated circuit, and its method of manufacture. It can be a digital or analog circuit. It consists of multiple layers of circuitry, while today's IC products can be accurately described as having a single layer of circuitry. It employs a small number of materials, and employs concurrent material growth and patterning. The fabrication apparatus will combine compatible processes such as a focused ion beam for pattern writing and molecular-beam epitaxy for crystal growth, a combination that has been reduced to practice. Reactive-ion-beam etching may be added to the combination. Other candidate processes are low-temperature sputter epitaxy, both for growing the host crystal and for delivering the small number of other species needed for doping and for forming monocrystalline insulating and (or) conducting inclusions. An option for pattern formation on the growing crystal is the projection of an energetic light image on its surface to cause localized diffusion of a monolayer or less of sputter-deposited impurity, followed by calibrated ion milling. A scanned laser beam could replace the flashed pattern. Other options for delivering the desired species are the stimulation of a chemical reaction at a growing crystal surface that will release the desired species in a chosen pattern, using a patterned-flash or scanned light-beam to provide the needed stimulation.

The new IC can employ monocrystalline self-isolating devices, such as a 3-D MOSFET, or internal-gate JFET, or the merged FET (MFET). Other device options include the junction-isolated JFET, and the insulator-isolated BJT. In addition to these active devices, there is the versatile punchthrough diode, also self-isolating and reduced to practice. It can be used as a level shifter, as a voltage regulator, and as an orthogonal isolator. An improved orthogonal-isolator structure is included in the present invention. The charge-coupled device (CCD) is a close relative of the MOSFET in terms of structure. It is also self-isolating, and in a 3-D array, will be useful for image processing. Monocrystalline 3-D capacitors and resistors will also be useful.

Applications for the new technology and product are numerous. As important digital examples for illustration we can cite memories for supercomputers. A supercomputer requires millions of logic gates, and billions of storage cells. Our 3-D concepts will greatly improve both, but especially will improve the performance and accessiblity of the bulk memory, and at the same time, will optimize cache-memory architecture. An analog application of great importance is the operational amplifier, that will be significantly improved by 3-D methods. While such amplifiers and supercomputers will benefit greatly from 3-D methods, there is another area that combines analog and digital requirements—one that cannot be realized at all without 3-D methods. This is the area of neural networks. There is no way to emulate the 3-D architecture of the brain and its enormous number of highly interconnected neurons without using 3-D structures. Image-processing 3-D arrays constitute another area of application.

DESCRIPTION OF THE PRIOR ART

The prior art, such as stacked CMOS, has been concerned with patterning and contouring various materials on the surfaces of semiconductor wafers by using a variety of techniques as a means of achieving more than one layer of circuitry on a substrate.

Prior work in three dimensions has been applied mainly to stacked devices, mostly CMOS, and circuits achieved by complex but largely conventional technologies. The motivation was to have the convenience of insulators for isolation and metals for electrical conduction while taking limited advantage of the third dimension. Numerous problems remain. First, there are reliability penalties because of the interfaces involved. Second and third, there are additional reliability and yield penalties connected with the necessary in-process storage and handling. Fourth, there is the thermal-conductivity penalty. Because power dissipation is already a problem in 2-D circuitry, power dissipation is a greater problem in 3-D circuitry and must be accounted for accordingly. The prior-art stacked approach also included problems of inadequate crystalline quality and control, and inadequate planarity in the advancing free surface. Stacking of largely conventional devices has been nothing more than an evolutionary extension of the existing prior-art processes in stacking semiconductor layers separated by an insulator and involving recrystallized material.

The present invention overcomes the disadvantages of the prior art by providing a monocrystalline three-dimensional integrated circuit. At a given feature size, the 3-dimensional IC provides for greatly increased volumetric densities, as well as improved reliability. Reliability is enhanced by the elimination of interfaces between dissimilar materials. Thermal properties are improved by the exclusion of amorphous material from within the monolith. An amorphous insulator, such as silicon dioxide, has thermal conductivity one hundred times worse than that of silicon. Furthermore, a monocrystalline three-dimensional integrated circuit can be fabricated in a continuous process which minimizes the number of different processing steps and reduces turn-around time. Thin silicide layers also provide for ohmic contacts and thicker silicide regions provide for conductors. An insulator can be provided about each entire device. The silicide and insulator regions combined with semiconductor regions constitute a monocrystalline integrated circuit.

Because the present invention is broad in application and expected impact, we must present an equally broad description of the prior art to make clear the basis of the proposed changes. For forty-five years, the evolution of solid-state electronics has been technology-driven. By this is meant that technological innovations, especially process innovations, have largely determined the pattern of progress and the shape of the product. Clear evidence of this fact is seen in the intense attention and interest that have been focused for decades on feature-size shrinkage and scale-of-integration expansion. In the 1950s we had few process options. We were "technique-limited," even in such basic matters as junction formation. Consequently, each major innovation brought a "new transistor" . . . grown-from-the-melt junctions, alloyed junctions, diffused junctions, and grown-from-the-vapor (epitaxial) junctions. Other major innovations of the 1950s were zone refining, photoresist processing, thermocompression bonding, ion implantation, planar processing, and MOS processing. By the 1960s, at least two options existed for nearly every fabrication requirement. But the pace of innovation was maintained, and continues to the present day.

There have, however, been a very few occasions in the period wherein strategic thought was dominant, and had a profound effect on the course of events. The creation of the transistor itself was the first example. The strategic goal was a solid-state device to replace vacuum tubes and electromechanical relays, on grounds that a device that operated at room temperature and had no moving parts would exhibit superior reliability. The strategic challenge was to identify a solid-state phenomenon that could deliver gain. The tactical challenge was to fabricate the device. Response to the tactical challenge launched the evolutionary juggernaut described above.

The monolithic integrated circuit (IC) grew out of another instance of strategic thought that took place thirty years ago. The strategic goal was to improve the reliability, economy, and funtional density of an electronic system. The strategic challenge was to devise component structures that could be integrated, and the tactical challenge, as before, was to fabricate the resulting products. Curiously, the insightful recommendations of thirty years ago have been only partly implemented. Furthermore, the technology-driven evolution of integrated circuits has taken us in the wrong direction in several respects.

In the present invention, our purposes are: (1) to implement fully the recommendations that led to the monolithic IC, and (2) to combine with these, recommendations that have come from thirty years of experience with the IC. The strategic goal is an electronic system of unprecedented reliability, economy, performance, and functional density. The strategic challenge is to define clearly the electronic-system features that deliver these four desirable properties, and then to combine all these features in a system. The tactical challenge is to examine existing technology to determine how close it can come to realizing the strategic recommendations, and then to fill in the gaps as necessary. Hence the strategic motivation of the present invention sets it apart from all but a very few of the prior-art innovations; the bulk of them have been tactical, and have fueled the technology-driven evolution. Also, it is significant that concern about reliability is common to all of the strategic moves that have been made in solid-state electronics.

A further relevant fact is that after thirty years of evolution, today's product is rapidly approaching barriers to further progress that are of a fundamental physical nature. Many experts have recently expressed this idea about today's technology, using the words, "it is running out of gas." Feature sizes and device sizes cannot get smaller forever. There exists an optimum scale, or size, for a given device, and its dimensions must inevitably be nonzero. Also, circuits and systems have grown so large that signal-propagation time imposes another fundamental limitation.

A starting point for the present invention was provided by the patents written by J. S. Kilby thirty years ago [U.S. Pat. Nos. 3,115,581, filed May 6, 1959, and issued Dec. 24, 1963; 3,138,721, filed May 6, 1959, and issued June 23, 1964; 3,138,744, filed May 6, 1959, and issued June 23, 1964]. His thesis in these patents was (paraphrasing) that the ends of reliability, economy, and functional density ("miniaturization," in the words of that time) in an electronic system can best be achieved by (1) minimizing the number of different materials embodied in the system, (2) minimizing the number of process steps required to fabricate the system, and (3) minimizing the qualitative differences among these process steps.

In the first part of his three-part dictum, his concern was with the poorly controlled and poorly understood physical and chemical phenomena that occur at dissimilar material interfaces, especially those interfaces that have electrical currents passing through them. The monolithic IC constituted a major advance over previous practice in this regard. For this reason, the IC caused reliability to increase so dramatically that the maximum size and complexity of a feasible system increased rapidly, system features that are fixed by acceptable mean time between failures, or MTBF. The validity of Kilby's insight concerning the importance of interfaces is beyond challenge, an assertion backed by mountains of empirical data.

Kilby's primary concern dealt with the number of dissimilar-material interfaces in each device-to-device electrical path, a matter that can be treated quantitatively. Simply count the number of such interfaces in the paths throughout a system, and then calculate an average number. In the era when each component had its own complicated, costly, and space-consuming encapsulation, this average value was in the ten-to-thirty range. With the advent of the monolithic integrated circuit, it plummeted to the two-to-five range. Steadily evolving growth in the scale of integration has reduced it further. Accepting, then, the principle that interface-count reduction enhances reliability, let us see what extensions of the basic concept can be made by drawing upon thirty years of experience with integrated electronics.

There is another way to look upon the interface matter. The issue of aggregate interfacial area in a circuit or system also has a bearing on that entity's thermodynamic stability. Evolutionary refinement and upscaled integration have produced a favorable trend line with respect to this criterion also. The aggregate-area matter is also amenable to quantitative assessment, and can be illustrated as follows:

For simplicity, focus on a single integrated circuit. The exterior of the semiconductor monolith constitutes one interface component. When the active face of the monolith is passivated, as it usually is, the interfacial-surface contribution of that face is roughly doubled; one must now include the oxide-to-air (or other passivant to other gas) interface component. Next, the external surface area of all metallic interconnections must be reckoned, surfaces, that is, not in contact with surfaces already counted. Finally, the internal and external surfaces of the IC package must be added, with a proviso similar to that for interconnections. Having done all this, one can compute an interfacial area per device (or per electronic function, if that is preferred). The smaller this specific area, the greater the thermodynamic stability of the electronic entity.

Evolution of the IC has produced further progress because the growing scale of integration has diminished the number of interfaces per function. Nonetheless, there has also been a tendency to use an increasing number of increasingly complex materials. The present invention reverses this latter prior-art tendency, proceeding to ultimate simplicity. It employs one, two, or three materials—a semiconductor with 3-D doping pattern, a semiconductor with a metal, or with an insulator, or with both. Furthermore substantially all of the materials constituting the new IC monolith will have single-crystal form, and substantially all will be lattice-matched. This modification goes well beyond Kilby's formula for diminishing interfacial problems. Today's IC products typically incorporate phases that are separately monocrystalline, polycrystalline, and amorphous. When the differing materials have differing morphology (e.g., amorphous versus single-crystal) as well as differing identities, the interface problems are more severe.

The surface that receives most attention in today's IC, and deservedly so, is the surface of the monolith whereon the circuitry resides. What step would drastically alter the importance and relative magnitude of this surface? The step of permitting the semiconductor substrate to "wrap around" the circuit components at the surface. With a slightly different point of view, one can describe this step as "burying" the devices. This approach accepts the observation that the best encapsulant for a device is a layer of the same material that constitutes the device [T. E. Zipperian, private communication].

Having made the components truly internal to the monolith, the next logical refinement is to position other devices above and below those already introduced, with appropriate interconnections among all. In other words, one should form a genuinely three-dimensional structure. With this step, the concept of volumetric functional density comes to the fore [R. M. Warner, Jr. and B. L. Grung, Transistors, Wiley, New York 1983, p. 65]. It is the only kind of functional density that really counts, since we inhabit a three-dimensional world. For thirty years there has been the obsessive attention (noted above) to areal functional density. But it is little more than a gauge of the state of the art.

Continuing with the single-IC example, let us make the plausible assumption that a semiconductor material will constitute the bulk of the circuit. The goal of minimizing aggregate interfacial area, then, is served by minimizing the volume and surface areas of any "foreign" inclusions. For example, continuous layers of insulating material should not be used if small, isolated regions will suffice. A further refinement in circuit and system integrity can be made by choosing for necessary inclusions, materials that are lattice-matched to the primary semiconductor material. For the case of silicon, there are satisfactory options for both insulating (calcium fluoride) and conducting (cobalt disilicide) companion materials exhibiting good lattice matches. This measure further diminishes specific interfacial energy and hence also aids the cause of stability.

An important heat-transfer benefit is conferred by 3-D geometry. Thermal design is a key issue in large systems, dramatically illustrated by the central part it plays in a successful supercomputer. In a conventional 2-D integrated circuit, the solid angle through which heat can be withdrawn by conduction from a given device through the semiconductor material is approximately $2\pi$ steradians. But the solid angle is approximately doubled by the change from 2-D to 3-D integration. Without resorting to comparatively elaborate fluid-flow cooling methods, one must accept heat loss from the free surface of a 2-D IC by the inefficient radiation and convection mechanisms. If the device in question is virtually surrounded by semiconductor material, on the other hand, the situation is much more favorable. These considerations are of particular importance for the case of silicon, which has a thermal conductivity that is about one third that of aluminum, and nearly two orders of magnitude better than that of silicon dioxide.

We also implement here the second part of Kilby's dictum, given at the same time and having equally sound footing; it was that the number of process steps should be minimized. In fact, process complexity and number of steps has monotonically increased. For example, the typical number of photoresist steps in the early 1960s was in the range from four to six. Today the typical number is over ten, and in some cases, as high as eighteen. Here the present invention's departure from the prior art is just as decisive as in the case of the first item. We eliminate discrete-step processing, and substitute a single continuous process.

A continuous process is a single process in the sense that no handling is needed between start and finish. It is easy to illustrate that such a change is much more than just a semantic game. In today's discrete-step processing, the cumulative yield is the product of all individual process-step yields. That is, each process step constitutes an opportunity for error or accident. Reducing the number of process steps favors economy in a very important way by boosting yield, and also in a direct way, because each step is an element of cost. We shall also accept, if necessary, a quasicontinuous process, meaning that brief periodic interruptions may occur so long as the work in process is not handled and experiences minimal changes in its ambient conditions.

The third part of Kilby's dictum was that the qualititative differences among the various process steps should also be minimized, and here again our invention proceeds to an ultimate and optimum result. Our 3-D monocrystalline approach will use a single apparatus to carry fabrication from start to finish. One can appreciate the importance of this change by scrutinizing the fabrication processes of the prior art for "compatibility," to use Kilby's term. The kinds of considerations that enter here are, for example, wet versus dry processes, elevated-temperature versus room-temperature processes, vacuum-system versus atmospheric-pressure processes, batch versus piece-at-a-time processes, continuous versus discrete-step processes, and so on.

Here again, as in the case of process number, we have seen regression, or "negative progress." Major incompatibilities can be illustrated by this example: The coefficient of thermal expansion of silicon exceeds that of amorphous silicon dioxide by more than a factor of five. Consequently, an oxide layer formed at a high temperature experiences extreme compression when the system has been returned to room temperature. Fortunately $SiO_2$ exhibits considerable strength in compression. But the fact remains that the oxide-silicon interface is a site of major stress. Interfaces are to be minimized in any case, and an interface of high specific energy is particularly unstable. After the oxide is selectively removed, the regions of stress and relief form very complex patterns. These highly stressed regions are responsible for some of the most vexing problems in today's products, such as those relating to hot-electron effects.

The single-process and single-apparatus features of our invention are tightly coupled, and deliver enormous advantages. To appreciate them, let us turn to a counter example, the preeminent discrete-step process drawn from the prior art, the photoresist process. In a gross simplification it is a five-discrete-step process: (i) apply, (ii) expose, (iii) develop, (iv) cut, and (v) remove. Each of these steps consists literally of some fifty substeps that must realistically be considered. Between each pair of substeps the work often waits, or is, in effect, in storage. Further, handling is needed to move the work from one station to another, and handling, whether manual or automated, is costly. In the continuous process, single-apparatus method, by contrast, the work in process experiences a nearly constant environment from start to finish. Refer back to the five-step photoresist example. Each step requires a different apparatus and subjects the work to a different environment. Discrete-step processes tend inherently toward incompatibility. Thus we can assert that progress in refining integrated electronics has been made largely in spite of changes in process number and variety.

The huge advantage of the present invention over prior art can be summarized as follows: An improved monolithic three-dimensional IC is fabricated in a single apparatus. The apparatus is programmable and fully automatic, under central control, with device-level customization possible. A typical manufacturing establishment will house a large number of such machines that are identical. Hence the manufacture of these apparatuses can benefit from the economies of mass production. Today's IC manufacturing employs large, costly, complicated machines that are produced in relatively small numbers—dozens, for example. Further, these prior-art machines are extremely widely varying in principle, operation, and use. The prior art employs hundreds of discrete steps in fabricating an IC. Between these steps or groups of steps the work in process must be handled, moved, adjusted, transferred, and so forth. In some cases, between certain groups of steps, the work is stored for hours, days, weeks, or even months. Handling and storage are opportunities for accidents, breakage, mistakes, and above all, contamination.

Because of the problems associated with discrete-step manufacture and the resulting need for storage and handling, the industry has invested ever greater sums in clean rooms of ever increasing size, and even cleaner local regions within these clean rooms. It is now becoming clear to many experts that evolutionary progress along these lines will be inadequate to reach the goal sought. Our approach, on the other hand, places the work in process inside a machine where it remains from start to finish and relaxes the cleanroom specifications to be adequate for equipment only. Furthermore, the new semiconductor factory will employ thousands of identical apparatuses, amenable to the economies of mass production, as just noted. Today's equipment is fabricated in batches far too small to permit such economies.

It will be impossible to achieve the degree of contamination freedom in a clean room that is readily achievable in a vacuum system. There is no chance of achieving such a tiny fraction of an atmosphere, and the associated cleanliness, in a clean room. If it were attempted, putting technicians and operators in space suits would be the least of the problems. Robots could of course be used, and serious efforts to do just that are being made now. But the necessary building would be caisson-like and totally impractical. Furthermore, gases (if needed) are available at far higher purities than the liquids of the prior art. Hence an enormous improvement in contamination freedom is achieved by continuous fabrication within a single vacuum system. An accompanying benefit is that the overall clean-room requirements of the industry can be far less stringent than those of the prior art. The levels of ambient cleanliness required by an apparatus are far less severe that those required by work in process; it is the latter requirement that exists in the prior art, because at various times and various places, work in process is exposed to the factory atmosphere.

In contrast to our truly 3-D electronic system, the prior art has produced only pseudo 3-D technologies that are merely evolutionary extensions of 2-D technology. One form of the prior-art "stacked" circuitry, the most primitive form, simply places one 2-D IC on top of another, another on top of that, and so forth. This has proven to be unrewarding. The problem of establishing more than a few peripheral electrical contacts from layer to layer remains unsolved. The layer of 2-D circuitry in a semiconductor die or "chip" typically occupies far less than one percent of its thickness, and hence of its volume, so the resulting volumetric packing density is very low. Partly because of this inefficiency, extracting heat from the stack is difficult.

An evolutionary but still brute-force extension of this stacking concept [J. P. Colinge and E. Demoulin, *IEDM Tech. Digest*, 557, December (1981)], employing conventional technologies, has been lavishly funded in the U.S. and abroad for about ten years, but has been similarly unproductive. It employs a single substrate incorporating a largely conventional 2-D integrated circuit. Over this, a layer of insulating material is deposited. Holes or "vias" are cut through the insulating layer to permit electrical connections from layer to layer. A layer of semiconductor material is deposited over the insulator, and is treated to create the nearest possible approximation to single-crystal properties. Quasiconventional technology is employed to form a second layer of circuitry in the recrystallized material. Then another insulating layer is deposited, and so forth. Because the recrystallized semiconductor material is of poor crystalline quality, only inferior devices can be fabricated. Interfaces between materials of different identity and morphology produce reliability problems.

"Stacking" violates literally all of the criteria articulated above. First, consider the features of the resulting product that are proportional to the number of layers: Interfacial area; thermal resistance in the monolith; number of process steps; number of high-temperature excursions. Further, both defect density and surface nonplanarity worsen as the number of layers is increased. We confidently assert that a stacked product will be permanently inferior to even a 2-D product in both reliability and cost, a combination unlikely to stir enthusiasm in the marketplace.

It is implicit in the foregoing discussion that the new technology will employ some form of relatively low-temperature crystal growth as its central process, to be carried out in a single closed system—a "single-pump-down" operation. For a number of reasons, it is extremely important that high-quality crystal growth be accomplished at modest temperatures, such as 200° C. to 500° C.: Apparatus requirements are easier to meet; unwanted solid-phase diffusion is avoided; residual stresses resulting from thermal experience are diminished.

There are at present at least two primary options for crystal growth, and the future may well bring further options. The molecular-beam-epitaxy (MBE) option is carried out under high-vacuum conditions, or at about one trillionth of an atmosphere. The sputter-epitaxy option is carried out at about one millionth of an atmosphere. These pressures are relatively constant from start to finish. In the prior art, the work undergoes repeated excursions from atmospheric pressure to well below atmospheric pressure—and even above atmospheric pressure.

Even more important than pressure excursions are temperature excursions. Semiconductor crystals of the prior art—let us take the dominant example of silicon—are multikilogram ingots as much as eight inches in diameter. Such huge crystals have internal stress because they are grown at temperatures in excess of 1400 C., and are cooled to room temperature. During manufacture of the prior-art IC, slices cut from the large ingot undergo repeated temperature excursions to the neighborhood of 1000 C., and back to 20 C. The amount of new crystal volume that is added to the starting volume is extremely small. In the new technology of the present invention, the starting crystal or substrate will be appreciably smaller than that of the prior art, and will have lower levels of the stresses associated with size. Furthermore, a relatively significant volume of monocrystal will be added to the substrate in the IC fabrication process, and even more significantly, this will be done at a modest temperature of a few hundred degrees centigrade, such as 400 C.—roughly one thousand centigrade degrees lower than the temperature for the bulk of the crystal growth of the prior art. It is equally important that the work in process will be held in a relatively narrow range of temperatures during the fabrication process, with possible occasional excursions of two or three hundred centigrade degrees for crystal annealing.

It is cliche' to assert that photoresist is central in prior-art technology. Thus it is admittedly bold to state that the 3-D approach in this invention eliminates the use of photoresist processing. The reasons for taking this step are numerous and persuasive. Consider these aspects of photoresist technology:

It is resolutely a "batch" or discrete-step process, and cannot be incorporated in even a quasicontinuous process.

It is dirty, historically being a major contributor of contamination problems, laid at the door of the organic material that is alternately deposited on the IC surface, and then is removed (or approximately removed) in preparation for the next step.

It is complicated; defining the process segment from one photoresist application to the next as a photoresist cycle, we can count the substeps and discover an average number of approximately fifty.

It is costly; one photoresist cycle involves the use of several large, expensive, elaborate apparatuses.

It is inhomogeneous; the big machines employ widely differing principles and subject the work in process to wide-ranging environments.

It is a bottleneck; in some steps (such as diffusion), slices are handled in large batches. They then wait in storage to go through the resist-connected substeps one at a time. When a stepper is used, the operation is carried out on less than a one-slice-at-a-time basis. Hence the highly touted "batch-fabrication" aspect of prior-art technology is invalidated to a major degree because of the uneven commitment to the batch as one goes from substep to substep.

How can we afford to give up the only process in wide use for achieving lateral definition? There are several options, now in various stages of development in laboratories throughout the world. These are sometimes described as resistless. This term has honorable but archaic antecedents, such as "wireless" and "horseless." A better term probably is in situ, conveying the idea that the work need not be moved or handled in order to carry out a given fabrication operation. Thus the fabrication process of the present invention will consist primarily of growing a semiconductor crystal at a modest temperature, such as 400 C., while delivering various other species to the growing surface in the amounts and patterns needed to create the doping structure and inclusions of a monocrystalline 3-D integrated circuit.

One option for forming a 3-D doping pattern in a semiconductor crystal as it grows is the combination of MBE and a focused and steered beam of specific impurity ions. This has been accomplished in the prior art [E. Miyauchi and H. Hashimoto, *J. Vac. Sci. Technol.* A 4(3), 933, (1986)], and can be described as on "existence proof" for in situ fabrication. These workers, however, have fabricated optical devices and have not seen the wide range of possibilities for device structures useful in 3-D IC products, especially digital products. Neither have they seen the advantage of combining reactive-ion-beam etching [L. D. Bollinger, *Solid-State Technol.* January, 1983] with their technology for the removal of material from selected areas, thus preparing the surface for inclusions.

There are also several patterning technologies wherein energy is delivered to selected areas in the form of light. This can be accomplished (for example) by laser holography, by laser rastering, or by the projection of a mask image (with the last giving a good reason for avoiding the term "maskless" that is sometimes used).

Another important and versatile low-temperature crystal-growth method, also compatible with patterning techniques, is sputter epitaxy. While the pressures here and in MBE are alike in being tiny fractions of atmospheric pressure, the fact that they differ by a factor of a million affects in an important way the methods that can be used to deliver other species to the growing crystal. In particular, the motion of an atomic or molecular species as a projectile inside the system is affected by gas pressure. Its mean free path, or the average distance it can travel between collisions with an atom or molecule of the ambient gas, is a sensitive function of pressure in that low range. Hence in order to create a beam of ions, for example, mean free path must be large compared to the distance from the beam source to the substrate. For this reason, a focused ion beam is compatible with MBE, but not with sputter epitaxy.

Fortunately, however, sputter epitaxy [G. K. Wehner, U.S. Pat. No. 3,021,271, filed Apr. 27, 1959, issued Feb. 13, 1962; G. K. Wehner, R. M. Warner, Jr., P. D. Wang, and Y. H. Kim, *J. Appl. Phys.* 64, 6754 (1988)] possesses highly significant advantages:

It is fully compatible with ion milling, a process in which material can be removed from a sample in a highly controlled and highly uniform manner. The material removed is pumped away and eliminated from the system.

It is compatible with the light-patterning methods, letting the light enter the system through a window.

It is also compatible with the equally precise deposition of dopants and inclusion materials. (This is particularly important for applying the principles of atomic-plane doping to 3-D IC fabrication.) To deliver any material, one simply provides a target of the desired material in solid form, positioned in the vacuum chamber so that it can "see" the substrate. Electrical bias applied to a given target determines whether material is removed from it (to be deposited on the substrate) by ion bombardment in the sputtering process. A mechanical shutter protecting each target is a desirable refinement to prevent the deposition on the surface of the target of materials removed from other surfaces. In this manner, a dopant such as boron (for the case of silicon) can be delivered. As another option, doped silicon can be grown by sputtering material from a doped-silicon target. A mass-conservation principle causes the doping of target and deposited layer to be the same.

Let us choose the example of silicon for illustration of a preferred method for growing a semiconductor crystal with a 3-D doing pattern. A uniform P-type doping, as in the present example, will usually be desired for the matrix, or surrounding semiconductor, in a 3-D IC of this invention. Let us assume the use of a semiconductor target appropriately doped with a P-type impurity.

For the $N^+$ device parts and interconnections, we will employ phosphorus, antimony, or arsenic in a similar fashion, but in higher densities. A silicon target with $N^+$ doping will serve. In this case, however, unlike the case of the P-type matrix, patterning is necessary. In the present example, the dopant that is to be patterned is first delivered uniformly to the substrate in an extremely thin layer (a fraction of a monolayer or a few monolayers). Then the dopant is caused to diffuse slightly into the surface in selected areas to a depth of a few atomic layers, or much more if desired. This is accomplished by the local delivery of light energy that is converted by the crystal into heat energy, causing diffusion. The patterned delivery of energy can be accomplished with an energetic flash of visible light, patterned by projection through a mask much like the reticle of the prior art, and focused on the substrate. Ultraviolet light could also be used, in which case a quartz window, quartz lenses and a quartz-based reticle would be necessary. The transparency problem can be diminished by using some reflective optics.

As another option, the light delivered to the substrate could take the form of a laser beam, rastered over the surface, thus eliminating the mask requirement. Such laser systems are now under active development, but wrongheadedly, for exposing photoresist [L. F. Halle, *IEEE Circuits and Devices Mag.* 4, 11 (1988)].

Once localized diffusion has been induced, the next step is to remove dopant from the undiffused areas. This is accomplished by a uniform ion-milling step, calibrated to remove one or a few monolayers. This step will remove all of the superficial dopant from the undiffused areas, but will not touch the dopant that has diffused, even to depths as shallow as a few monolayers, in the selected areas. An annealing step, if needed to activate the impurities, can be accomplished by a general (unpatterned) light flash, creating the conditions of rapid thermal annealing.

The creation of monocrystalline inclusions is somewhat more complicated, but yields to similar methods. In some cases, such as the creation of a calcium-fluoride region, two species must be delivered rather than just one when MBE is used. In the case of sputter epitaxy, however, advantageously one can use a calcium-fluoride target to deposit insulator, and a cobalt-silicide target to deposit a metal phase. The mass-conservation principle mentioned before yields the correct stoichiometry, and flash annealing can create the desired monocrystallinity.

A more significant complication, however, is that these inclusions will often have significant thickness. Thus it is necessary to create a depression on the surface in which to place the inclusion, or else to grow crystal on the remaining regions, either before or after the inclusion is formed, or else one must use some combination of material removal and delivery. Current efforts with excimer-laser beams have shown feasibility for both silicon epitaxy [R. W. Waynant (Ed.), *IEEE Circuits and Devices Mag.* 4, 1 (1988)] and material removal [P. Burggraaf (Ed.), *Semiconductor International*, 117, May, 1988], so that selected-area surface contouring is a viable option.

A classic problem in analogous procedures is achieving the desired "close fit" and perfection at the periphery of the inclusion. It is for this reason that an oblique 3-D array of identical elements is proposed above, since each new element could then be formed in a fresh region. By the time an element is placed directly above another, enough crystal layers have been grown so that "healing" has occurred.

Another and quite different option for patterning exists. The sputtering chamber can be filled at low pressure with a gas that can be decomposed by light, releasing desired species in the process [D. J. Ehrlich, J. Y. Tsao, and C. O. Bozler, *J. Vac. Sci. Technol.* B 3(1), 1 (1985)]. Patterned light striking the substrate can cause surface chemistry to proceed in selected areas, with inclusion of the desired species through subsequent crystal growth. While there is much current work on patterned light exposure using lasers, the flash exposure of the surface raises the further possibility of using an electronically alterable pattern generator, such as a liquid-crystal display. Keeping the growing crystal surface in the position of sharpest focus can be done with the piezoelectric method developed for the scanning tunneling microscope.

In yet another option, sputtering impurity atoms through a shadow mask may be employed. Again the technique of atomic-plane doping permits one to simulate a continuously doped region by creating fractional-monolayer planes of dopants in selected areas. There is no problem of step creation in the growing crystal because the desired areal densities of such dopants are extremely low. Sputtering, in particular, is able to deliver such density values with precision.

A traditional prior-art problem associated with the shadow mask is that of trying to provide "a stencil for the letter O." But that problem is avoided in our invention. One simply provides two masks for successive use that include overlapping portions of the closed pattern. In the regions of overlap the doping density will be twice as high as in the nonoverlapped regions. But in matters of doping where factors of a million or a billion or more from one region to another are commonplace, a factor of two constitutes a negligible difference.

The advantages of three-dimensional circuits have had a prior examination in abstract terms [A. L. Rosenberg, *J. Ass'n. Comput. Mach.* 30, 397], without consideration of practical device, circuit, and fabrication issues. More recently, fractal theory has been applied to the problem [A. Terao, F. Van de Wiele, *IEEE Circuits and Devices Mag.* 3, 31 (1987)]. The prior observers acknowledge that major advantages will be gained for large, complex, high-performance circuits, but for the few cases wherein they descend from abstract issues, they assume the indefinite continuation of photoresist technology. Thus it is clear that they have not even glimpsed the essence of the present invention.

Employing a different approach and avoiding the esoteric arguments of the prior art, we can demonstrate 3-D-circuit advantages through simple geometrical arguments. Let us focus on an IC building block, or cell, such as a logic gate, or a latch. First, with respect to the overridingly important matter of power dissipation, the circuit situation is parallel to that for the device: a cell can lose heat by conduction through a solid angle of approximately $4\pi$ steradians, rather that $2\pi$ steradians as in the prior-art 2-D case. When the matrix is silicon, thermal conductivity is high.

There are next a number of issues all relating to making the necessary connections from one cell to another, whether the connection is a power bus, a clock line, or a signal path, issues that can be collectively labeled matters of connectivity. All of them yield to elementary quantitative analysis.

One matter concerns finding room at the cell's periphery to make the needed connections. Take the prior art 2-D case first. Assume that minimum conductor width is $\delta$, as well as the minimum conductor spacing, so that the permissible center-to-center conductor spacing, or pitch, is $2\delta$. Assuming also a minimum spacing of a conductor from the cell corner to be $\delta$ as well then makes it evident that the minimum edge dimension for the cell is $(2N+1)\delta$, where N is the number of connections to made to that edge. Focusing on a square cell for simplicity gives us a minimum area (permitted by the peripheral-connectivity constraint) of $(2N+1)^2\delta^2$. The number of interconnection sites on this cell is evidently 4N.

Now turn to the 3-D analog, adopt a cubic cell for parallelism, and retain the minimum dimension $\delta$. Further assuming a conductor cross-sectional area of $\delta^2$ is appropriate, because comparatively resistive semiconductor interconnections are being allowed. It is apparent that the surface area of a single cube face is $(2N+1)^2\delta^2$, the same as the area of the 2-D cell. But this time the connection sites on one "boundary" number $N^2$ rather than N, and the total number of sites for the cell is $6N^2$ rather than 4N, the "bristleblock" advantage. Even when N is as small as two, the 3-D option gives a 3X advantage; with N=4, the advantage is sixfold.

As the next matter, let us examine the availability of regions within an IC that can be devoted to the conductors necessary for interconnecting the cells. One would like the area or volume so invested to be a small fraction of the total, but sometimes the fraction becomes inconveniently large. In prior-art 2-D parlance, the accompanying constraint is often termed a "routing limitation." It is not unusual for half the area of a 2-D IC to be devoted to interconnections. The reason that this constraint is so severe in the 2-D case is that there are only two categories of available channels for interconnection routing, categories corresponding to the two orthogonal directions. In the 3-D case there are three orthogonal directions. But in addition there are six diagonal directions! (These correspond to the two diagonal directions on each of the x, y, and z faces.) Thus the transition from 2-D to 3-D geometry increases the number of available channel directions from two to nine, or by a factor of 4.5. One could object to the counting of the unfamiliar diagonal channels, but the objection is not valid. In a 3-D circuit, linear diagonal conductors can pass between cells, while this is not possible in the prior-art 2-D circuit.

The routing issue goes deeper than having an unfavorably large fraction of circuit area devoted to wiring in the prior-art 2-D case, especially in gate-array design. In some cases, one simply "can't get there from here." Crossovers are both costly and troublesome, aggravating crosstalk difficulties, for example. They must be used in moderation. Hence the 3-D advantage, described above in terms of routing channels, could alternatively be expressed in terms of having greatly expanded opportunities for interconnection, all the while maintaining greater conductor spacing than is possible in the 2-D environment.

The comparison of routing flexibilities can be emphasized further by looking at local access to other cells. In the two dimensions of the prior art, a cell has access to eight surrounding cells without "jumping over" an intervener. But the 3-D situation is over three times better. Counting the six faces, eight corners, and twelve edges of a cube (or parallelepiped in the general case), one arrives at 26 adjacent cells.

The next important concern is the matter of average interconnection length. Turning the question around, and asking how many cells are within reach of a given cell using a line of a given length makes this issue amenable to a quantitative analysis as simple as those foregoing. In the two dimensions of the prior art, the number of square cells within the radius r of a focal cell is proportional to $\pi r^2$, while in three dimensions, the number of cubic cells (let us assume the same edge dimension d in the two cases) is proportional to $(4/3)\pi r^3$. Considering the fact that interconnection orientation is much more severely constrained in two dimensions than in three, this comparison (which permits arbitrary orientation) is heavily biased in favor of the 2-D option. Using the edge dimension d to normalize the radius r, it is evident that the 3-D advantage amounts to $(4/3)(r/d)$. Hence for the relatively small value $(r/d)=7.5$, the 3-D case is already more favorable by an order of magnitude.

Finally, the matter of volumetric functional density can be illustrated by similar means. By today's standards, a square measuring 100 μm by 100 μm is very large. (It is approximately the size of a bonding pad, the metallized square placed on the periphery of an IC for attachment of a lead wire.) It follows that a cube measuring 100 μm on an edge is a relatively large volume. But the number of these "large" cubes that can be fitted into a volume of one cubic centimeter is one million! One billion such cubes can be fitted into a cube measuring only 10 cm on an edge. In fact substantial volume can be devoted to cooling arrangements in such a volume, because 3-D building blocks are unlikely to be cubic in form, being instead foreshortened in the growth direction.

Just as there are several fabrication options, there are also a number of device options. The challenge is device isolation. Fortunately the MOSFET is just as self-isolating in three dimensions as it is in two. A device is said to be self-isolating when it does not require separate, dedicated reverse-biased junctions or regions of insulation around it to accomplish isolation. In the 3-D N-channel MOSFET, a P-type silicon "matrix" surrounds the device completely, except for the regions where electrical connections extend away from the device. The drain region is normally positive with respect to the matrix, which is at the most negative voltage in the circuit, and hence the inherently reverse-biased drain junction accomplishes the isolation of that region. Similarly, the source and field-plate (gate) regions are more positive than the matrix, or are at the same voltage. (The gate dielectric we sometimes describe as an "active" insulator, in the sense that it is an inherent part of the device, and is not simply an insulating layer placed around a device for isolation.) Although a 3-D MOSFET has yet to be demonstrated, there is an existence proof for a GaAs-family monocrystalline MOSFET having near-insulating and near-metallic regions consisting of lattice-matched materials [P. M. Solomon, C. M. Knoedler, and S. L. Wright, *IEEE Electron Device Lett.* 5, 379 (1984)]. These workers, however, seem unaware of the self-isolating character of the MOSFET, and they have not glimpsed the advantage of burying their device in a semiconductor crystal, interconnecting it into a 3-D circuit that will perform a useful function. Letting the choice of semiinsulating semiconductor, used in this prior-art example, constitute an option separate from a true insulating inclusion is parallel to letting a heavily doped semiconductor region be an option separate from a true metallic inclusion. When all of these options have been factored in, variations on the monocrystalline 3-D MOSFET are numerous. This 3-D MOSFET can be described as MOSFET-like, since it differs from the conventional MOSFET. A further difference can be created by substituting for the usual inversion-layer channel one or more quantum-well channels [N. C. Cirillo, A. Fraasch, H. Lee, L. F. Eastman, M. S. Shur, and S. Baier, *Electron. Lett.* 20, 854 (1984)].

The field plate can be either a heavily doped semiconductor region or a metallic region, but let us assume that the field plate and its electrical lead are of the same material. The source and drain, however, must consist of a semiconductor material (let us take the N-type case as type-1 semiconductor), while their leads may be either metallic or semiconductor material. The gate-dielectric region may be of insulating or insulating-semiconductor material. Finally, the "balance" of the 3-D MOSFET, which is to say, the surrounding matrix, may be type-2 semiconductor, insulator, or insulating (semiinsulating) semiconductor. There is a thermal advantage in the first choice, especially for the case of silicon. But in that case, metallic interconnections should probably be avoided, unless they are insulator-protected. These resulting options are ten in number. If one lets the choice of having a floating or connected substrate be yet another option, then of course the total rises to twenty.

There are junction field-effect transistors (JFETs) of unusual structure that have the useful property of being self-isolating, such as the internal-gate JFETs of FIGS. 5 and 8. Although the surrounding matrix acts as a parasitic gate, its light doping renders it less efficient than the heavily doped internal gate. To make electrical contact to the internal gate, it is sometimes possible to extend semiconductor "wiring" through the opposite-type source or drain lead.

A second self-isolating JFET-like device is the merged FET, or MFET [W. T. Cardwell, Jr., U.S. Pat. No. 4,638,344, filed Apr. 15, 1982, and issued Jan. 20, 1987]. It differs from a conventional JFET in that a gate region is separated from the channel not by a single junction, but by two closely spaced junctions, one that can be described as the gate junction, and the other, as the channel junction. Their depletion layers interact by virtue of proximity. Manipulation of depletion-layer thickness in the former causes modulation of that belonging to the latter, and hence causes modulation of the degree of channel depletion.

While Cardwell has devised a self-isolating device, he has not grasped the concept of a three-dimensional integrated circuit, and has neither shown nor claimed the concept. All of his devices are located at a semiconductor surface, and all of their terminations proceed directly to that surface. In our monocrystalline 3-D IC, at least one buried device is connected only to similarly buried devices, and is not connected through a nodeless conductor to a surface.

The ordinary prior-art JFET is not self-isolating. However, it can be isolated by placing a passive lattice-matched insulator blanket around the gate region. A second option would use insulator-protected metallic interconnections. Extending the insulating jackets over the source and drain regions would protect them, and converting to an N-type matrix would mean that P-type gate region was self-isolated from it. Further, the JFET can employ an isolating box with integral orthogonal isolator as used by the two cross-coupled JFETs in FIG. 3. The "gasket" encircling the gap between the box parts, to accomplish cross coupling from the gate of one device to the drain of the other, can be improved. It is desirable to minimize the bulk, surface area, and hence the parasitic capacitance of the structural portions that undergo voltage change, such as these cross-coupling elements. Thus, in the driver JFETs of an Eccles-Jordan latch, FIG. 4, the source-connected portion of the box should dominate, and the drain-connected portion should be as small as possible. To accomplish this, we give the member emerging from the box the form of a rod with a flange to accomplish orthogonal isolation. The flange can be internal or external to the box, but the latter is preferred.

The conventional JFET is usually a normally on or depletion-mode (D-mode) device. That is, the N-channel device has a positive characteristic current $I_{DSS}$ when $V_{GS}=0$. A negative gate voltage is necessary to reduce drain current. Because the input (gate) voltage is thus negative, while the output voltage from the simplest inverter is positive, voltage translation or level shifting is necessary. Such voltage translation is readily accomplished using punchthrough diodes. Such an arrangement, straightforward but relatively device-intensive, constitutes a D-mode bistable latch.

Fortunately the E-mode JFET is a well-established device both in silicon [C. Arnodo and G. Nuzillat, *Review Technique Thomson-CSF* 7, 281(1975)] and in GaAs [R. Zuleeg, J. K. Notthoff, and K. Lehovec, *IEEE Trans. Electron Devices* 25, 628 (1978)], satisfying the designer's preference for E-mode operation, and eliminating the need for level shifting. One simply designs the JFET channels to be fully pinched off at equilibrium; a positive input voltage then causes "unpinching" and conduction. There is however, an upper limit on channel conductivity for any JFET, conventional or unconventional, a value fixed by channel geometry and areal net-impurity density; once channel depletion is fully eliminated, no further conductivity increase is possible. From this fact it follows that the E-mode-operation range is constrained. A further constraint is imposed by the fact that the gate junction goes into significant conduction at the point of channel-conductivity saturation. By contrast, the E-mode MOSFET is a superior device from this point of view. Its inversion-layer channel conductivity can in principle be increased without limit by increasing gate-source voltage.

The circuit consequences of the limited E-mode-operation range common to all JFETs are (1) small logic swings and (2) low noise margins. Since it has been convincingly shown that increasing noise margins (and hence logic swing) improves circuit reliability [Q. Le and A. Tuszynski, to be published], this E-mode JFET feature is unwelcome in an enterprise aimed at reliability improvement. But it has also recently been shown that there are purely circuit-design methods for tailoring noise margins and logic swings for any E-mode device of finite input conductance [R. J. Gravrok and R. M. Warner, Jr., U.S. Pat. No. 4,868,904, filed November 1988, and issued September 1989]. These methods use in concert current regulators, for which a JFET or else a BJT current mirror are useful, and voltage regulators, for which a punchthrough diode or else a Zener diode are useful.

It is of particular importance that the new circuit techniques apply to the BJT, which in both its most primitive logic configuration (direct-coupled transistor logic, or DCTL), or in its currently supreme and most sophisticated logic circuitry (emitter-coupled logic, or ECL), displays noise margins that are smaller than usually desired. The reason is that the BJT exhibits gain properties vastly superior to those of all FETs, including the MOSFET. It has been shown that an FET of any kind can merely approach the transconductance of a BJT, and can never surpass it [R. M. Warner, Jr. and R. D. Schrimpf, *IEEE Trans. Electron Devices* 34, 1061 (1987)]. To clinch the case, the regime of closest approach involves current levels so low as to be unusable.

On the matter of BJT isolation in three dimensions, one could argue that it should be no more difficult than isolating an E-mode JFET, since in either case the maximum forward voltage is that of the ON junction, or $V_{BE}$. In fact, however, BJT operation requires appreciable conduction through the forward-biased emitter junction, while JFET operation limits gate-junction conduction to low levels. Thus, insulator isolation is mainly but not exclusively foreseen for the BJT case.

In addition to these active devices, there is the punchthrough diode that was noted in connection with the orthogonal isolator, which embodies it, and noted also for level shifting and voltage regulation. It is fortunate that such a useful device is self-isolating in three dimensions, and has a structure that is unusually simple. A punchthrough diode can be realized simply as a gap in semiconductor "wiring." Here again, the type-1 semiconductor that constitutes the conductors is heavily doped, and the type-2 semiconductor that composes the matrix is more lightly doped. When the structure is symmetric about its median plane, the I-V characteristic also exhibits bilateral symmetry. Creating an asymmetric I-V characteristic is a matter of straightforward design. Precise fabrication is needed for the punchthrough diode, but the investment is well-rewarded. Not only is this device far simpler than the IC diode option (a diode-connected-BJT), but it is also a superior voltage regulator for any voltage in excess of one diode drop [R. J. Gravrok, private communication], and it is continuously variable by design rather than offering only integral multiples of a fixed voltage.

The CCD or charge-coupled device [W. Boyle and G. E. Smith, *IEEE Spectrum* 8, 18 (1971)] is a close relative of the MOSFET, is equally self-isolating in 3-D, and in large 3-D arrays it will have significant applications for image processing. In addition, 3-D capacitors and resistors are also self-isolating, and will also be useful, especially for analog circuits.

Now that device structures have been reviewed, we are in a position to emphasize a feature that clearly distinguishes the present invention from the prior art. The regions of insulator in the 3-D devices of the present invention are always localized. This holds for an active insulator, as in the gate of a 3-D MOSFET, or a passive insulator, like that surrounding a conductor or a device for isolation. The prior art, by contrast, is infested with layers of insulator, each with an area equal to that of the substrate. The serious penalties of that situation are the thermal-conductivity degradation and the inferior quality of the overgrown semiconductor crystal. Even when an effort was made by prior workers to depart from the brute-force amorphous-insulator layer, they failed to recognize that the presence of one or more insulator layers exacts a heavy price [Y. Mizutani and S. Takasu, U.S. Pat. No. 4,479,297, filed June 9, 1982, and issued Oct. 30, 1984]. They have proposed using monocrystalline cerium oxide, $CeO_2$, for supporting the subsequent growth of a lattice-matched silicon layer. But before that they convert the silicon immediately below the $CeO_2$ layer into a continuous amorphous layer of $SiO_2$ to serve as insulator between planes of MOSFET circuitry. Thus they too have overlooked the self-isolating nature of the MOSFET and the huge advantage of eliminating extensive layers of amorphous insulating material from the IC.

Applications of the improved monocrystalline three-dimensional integrated circuits and systems are numerous, and fall into at least four broad categories: digital; analog; image-processing; and image processing. Let us employ examples. Of great importance among digital applications are memories for supercomputers. The central or bulk store of a supercomputer requires billions of storage cells. Prior-art limitations are severe. The outer dimensions of a present-day supercomputer are of the order of meters. Signal propagation time just within the bulk memory can be appreciable. Shrinking overall system dimensions to a few tens of centimeters through the 3-D density advantage will bring significant shortening of necessary paths. Another severe problem of prior-art designs is chip-to-chip communication. When driving a signal off-chip, one encounters parasitic capacitance some three orders of magnitude greater than the on-chip parasitic magnitudes. The combined effects of distance and parasitic loading cause transmission delays to be long and uneven. Skew in signal arrival time in these prior-art systems in turn causes soft errors that are difficult to pin down, and hence, serious degradation of reliability. In the 3-D implementation of bulk memory, distances are smaller, functional blocks have higher content, and there are fewer IC-boundary crossings.

Most supercomputers are called upon to provide concurrent access to a number of users. This is accomplished by providing a number of cache memories, each cache dedicated to a particular user. An ideal cache memory is adequately large, adequately fast, and close to its processor. It should be large enough to hold the instructions and data for a medium-difficulty program. In this way, data in the bulk store need only be updated at the completion of a task. If intermediate consultation of bulk memory is required, delays are inevitable, conflicts can arise, and throughput suffers. Its speed should approximate that of the processor, and its proximity to the processor is dictated by the large amount of data swapping required during problem solving. All of these cache-memory features will benefit from 3-D architecture. Functional-block capacity and performance are favored thereby. Also, the cache and processor can be integrated into the same block.

Supplanting both kinds of prior-art memories by 3-D implementations will permit expansion of access at low cost in signal dispersion. The greater ease of access imparted by 3-D structure can be illustrated by pointing out that it permits reading out data a page at a time, rather than a line at a time. Furthermore, the 3-D memories will be free of the vulnerabilities of today's electromechanical mass-storage systems.

Error correction in a memory is necessary, even though errors are rare in a well-designed system. At the heart of the error-correction problem is the matter of access to the stored data. In the prior-art 2-D case, one gains access readily only to a single string of bits. In a typical case, the string will consist of 64 bits. To verify that this data set has not changed, one employs a code, such as a Hamming code. A coded message must be stored along with the data string itself, and for 64 bits of data, seven additional bits of code are required, constituting an 11% storage burden. Hence error correction is costly: one must store the additional data, one must provide the additional logic to execute the coding function, and one must accept the delay this operation imposes on the system.

An important fact, however, is that the code-bit burden increases only slowly with the number of data bits being checked. Visualize, now, a 3-D system wherein a 64-bit word is once again accessible from a single plane of data, but 128 planes exist parallel to each other. From a single line across the edges of these planes, therefore, one has access to 8192 bits of stored data, for which the code burden amounts only to 14 bits, or 0.2%. The decoding burden increases with equal slowness as a function of accessible data-set size.

But 3-D architecture also opens up new kinds of data-correction opportunities—new approaches and techniques. For example, it becomes possible to examine parity in a y direction and a z direction, with the overhead this time amounting to a single parity bit for each direction. Intersection of a pair of faulty parity readings locates a faulty bit. What is equally important, the penalty for performing the necessary comparison of parity-check results is the delay of a NAND gate. A similar method can be used for verification after error correction.

In theory it does not matter how storage cells are configured or accessed, but in practical engineering, even the feasibility of a given error-correction algorithm depends upon the reliability of the retrieval and correction process. For this reason, in a 3-D system it will be possible to correct even burst errors, while in prior-art systems it is totally impractical to do so.

Analog applications of 3-D IC architecture will also benefit, with the operational amplifier providing an important example. A serious problem in analog electronics is the always-present specter of parasitic oscillations, particularly, in nominally open-loop circuits. It is a result of crosstalk, converting an open system into a feedback system. In the 2-D circuits of the prior art, crosstalk occurs in the inevitable crossover present in the two-stage front end of an op amp. The topological freedom present in 3-D architecture, by contrast, permits one to make the necessary connections from one bristleblock circuit segment to another without a crossover. The result is a much improved op amp.

While supercomputers and op amps will benefit greatly from 3-D methods, neural networks [J. J. Hopfield, *IEEE Circuits and Devices Mag.* 4, 3 1988)] cannot be realized at all without 3-D methods. There is no way to emulate the numbers and 3-D architecture of the brain without using 3-D structures. In spite of the fact that neural signal propagation is ten million times slower than in a present-day IC (about 3 meters per second, as compared to 30 million meters per second), the human nervous system rapidly and reliably performs tasks that elude the most powerful computers. More pertinent, perhaps, is the fact that intrinsic device speed is about 100,000 times greater in silicon VLSI than in neurobiological devices, but yet a pigeon can accomplish a face-recognition task that a computer has yet to achieve [Hopfield]. Further, a brain has astounding learning and self-healing capabilities, and it performs well in noisy environments. The structure of a neural circuit changes every time learning occurs, while structure is a constant in conventional electronic circuits.

Although the principles and functioning of this biological system are only dimly understood, some features are becoming clearer than they were just a few years ago. The brain relies on massive parallelism and copious cross-coupling among some $10^{12}$ neurons [E. R. Kandel and J. H. Schwartz, *Principles of Neural Science*, Elsevier Sci. Pub. Co., New York, 1985]. The system also has massive amounts of feedback, rather than having essentially unidirectional data flow as in a conventional electronic digital computer [Hopfield]. Also, a single neuron is far from being a simple latch. The simplest present-day model for a neuron is a summing amplifier with a huge number of inputs—of the order of $10^4$—derived from multipliers. Further, each neuron has associated with it perhaps ten glial ("glue-logic") cells. Neither the amplifiers nor the multipliers need be very accurate [H. P. Grof and L. D. Jackel, *IEEE Circuits and Devices Mag.*, 5, 44 (1989)], but the numbers needed are staggering. Only the high functional density and the routing freedom of 3-D technology will be able to emulate the structure and performance of nature's 3-D network system. The prior art will permit at most some limited feasibility studies in selected areas. In 3-D, the combination of optical input and output to the neural network with electronic processing in between will make possible the desired massive parallelism.

SUMMARY OF THE INVENTION

The object of the present invention is a monocrystalline three-dimensional integrated circuit, containing a 3-D doping pattern forming varied devices and circuits that may be junction-isolated and with interconnecting semiconductor signal paths and power buses, that also may be junction-isolated, usually N+ within P matrix regions, and tunnel junctions (N+-P+ junctions) or silicide inclusions as ohmic contacts from N-type to P-type regions. The matrix may contain a network of P+ regions to reduce its overall resistance. There are metal-semiconductor contacts at the outer surfaces. Devices of the present invention may be isolated by an isolating box that surrounds the active portion of the device. The box places back-to-back junctions between the device and the matrix material. To avoid shorting out a device, it may be necessary to interrupt the walls of the box with a thin gap that is normally depleted. This gap provides isolation between the top and bottom of the box and between the inside and outside of the box, thus providing orthogonal isolation.

Other purposes of the present invention include the use of thin monocrystalline lattice-matched silicide layers as ohmic contacts and thicker such silicide regions as conductors. Also, a monocrystalline 3-D device can be surrounded by an insulator.

The present invention also provides three-dimensional single-crystal devices of enhanced yield, reliability, and volumetric functional density in integrated circuits. The present invention may possess feature sizes that are commonplace in today's 2-D products, and eventually brain-neuron densities can be approached. Two basic structures achieve the present invention. One is a semiconductor monocrystal employing junction isolation, and/or the other is a monocrystal consisting of semiconductor plus lattice-matched metallic phases and/or including lattice-matched insulating phases, as well as near-metallic semiconductor regions and/or semi-insulating semiconductor regions.

According to one embodiment of the present invention, there is provided a monocrystalline device with a thin layer of silicide as an ohmic contact and/or a thicker region of silicide as a conductor. A silicon monolith containing a 3-D doping pattern, may or may not also contain metallic and/or insulating regions that are monocrystalline and fully compatible in structure with the silicon crystal. This structure is referred to as a monocrystalline 3-D IC.

The present invention is an improved monocrystalline three-dimensional integrated circuit that provides a three-dimensional array of interconnected devices performing useful electronic functions, especially but not exclusively digital functions. It employs a small number of materials—a semiconductor crystal having a 3-D doping pattern, with a metal, or with an insulator, or with both. Substantially all of the materials constituting the new IC monolith will have single-crystal form, and substantially all will be lattice-matched. The single-crystal monolith is grown continuously or quasicontinuously in a closed system, under automatic control. The apparatus carries the fabrication of one or a few circuits at a time from start to finish. A manufacturing plant will contain thousands of such machines that are identical. Therefore these systems are amenable to mass production, leading to major economies. There is further economy in the fact that the controlled environment for creating the IC monoliths is inside a closed system, rather than a vast volume of factory space. There is still further economy in that the environment inside the closed system is many orders of magnitude cleaner than that of even very expensive factory space, so that yield will be very high.

The continuous or quasicontinuous (having brief periodic interruptions with no handling of the work in process required) process constitutes a much more homogeneous technology than that used for today's product. The semiconductor crystal is grown at relatively low temperatures by a method such as sputter epitaxy or molecular-beam epitaxy (MBE), and experiences only small temperature excursions.

The formation of a 3-D doping pattern in a semiconductor crystal as it grows can be done in several ways. There are attractive applications of a programmed light beam or a patterned light flash in combination with sputter epitaxy. Impurities are delivered from a target uniformly over the substrate. Light energy is then used to cause diffusion of these impurities into the substrate in selected areas. Ion milling is then used to remove the impurity-containing layer from undiffused regions, while leaving significant amounts of impurity in the light-affected areas. Annealing steps can be added. A reflective mask can be used for pattern formation in lieu of a transmissive mask. Thus one can use an electronically alterable pattern generator, such as a liquid-crystal display. A similar selected-area method could be used for the deposition by sputtering from a solid target of insulator and (or) metallic regions.

The combination of MBE and a focused and steered beam of specific impurity ions is an additional option, and one that has been reduced to practice. Reactive-ion-beam etching may be added to the combination. Sputtering impurity atoms through a physical (or shadow) mask is yet another solution. Atomic-plane doping permits one to simulate a continuously doped region by creating fractional-monolayer planes of dopants in areas selected by the shadow mask. The desired areal densities of such dopants are extremely low so that step formation is not a problem, and sputtering can deliver such density values with precision.

Another option employs light to stimulate surface chemistry—a reaction between the semiconductor surface and a vapor species in the growth chamber. Lasers are presently being used for direct writing on an integrated circuit, as well as for material addition through epitaxy, and material removal through ablation.

A potential problem in achieving monocrystalline lattice-matched inclusions is that the fit and perfection at the periphery of the inclusion will be poorer than desired. For this reason, an oblique 3-D array of identical elements is proposed, since each new element could then be formed in a fresh region.

The 3-D array provides nine directions for interconnection channel routing, rather than the two directions of the 2-D case. The same 3-D advantage can alternatively be expressed in terms of having greatly expanded opportunities for interconnection, all the while maintaining greater conductor spacing than is possible in the 2-D environment. The reason is that a 3-D element is a bristleblock rather than a plane figure.

In a regular 3-D array of elements, each element has direct access to 26 adjacent elements, while in the 2-D case, there are only eight adjacent elements. Furthermore, the 3-D element has six areal faces available for interconnection, while the 2-D element has only four linear edges. A cell in 3-D has ten times as many other cells within a radius r as does a cell in 2-D, when r is merely 7.5 times the cell spacing.

Among several device options, the MOSFET is attractive because it is just as self-isolating in three dimensions as it is in two. A device is said to be self-isolating when it does not require separate, dedicated reverse-biased junctions or regions of insulation around it to accomplish isolation. There is an existence proof for a GaAs-family monocrystalline MOSFET having near-insulating and near-metallic regions consisting of lattice-matched materials. Variations on the structure of a monocrystalline 3-D MOSFET are numerous when truly metallic and insulating options are added.

There are also junction field-effect transistors (JFETs) of unusual structure that have the useful property of being self-isolating, such as the internal-gate JFET and the MFET.

Devices that are not self-isolating can also be used through box isolation and orthogonal isolation. Circuit elements in such an arrangement that undergo large voltage excursions can be made small in volume and area to diminish parasitic capacitance. For example, a cross-coupling connection can take the form of a rod, with a flange for orthogonal isolation.

As other options, monocrystalline lattice-matched insulating regions or insulating-semiconductor (also called semiinsulating-semiconductor) regions may be positioned about a device for isolation. In any case, the continuous or nearly continuous layers of insulator that are universal in competing technologies will be avoided, thus improving monocrystallinity and heat transfer in the monolith of our invention.

The E-mode JFET is a well-established device both in silicon and in GaAs, eliminating the need for the level shifting that is needed in, for example, a D-mode JFET latch. Because E-mode-operation range is constrained, small logic swings and low noise margins accompany it. But there are purely circuit-design methods for tailoring noise margins and logic swings for any E-mode device of finite input conductance, and these methods will be used when advantageous in the 3-D IC.

The new circuit techniques apply to the BJT, which exhibits gain properties vastly superior to those of all FETs. In both its most primitive logic configuration (DCTL), and in its currently supreme configuration (ECL), the BJT displays noise margins that are smaller than desired. Insulator isolation is foreseen for the BJT case.

In addition to these active devices, there is the punchthrough diode that is useful for level shifting and voltage regulation. It is self-isolating in three dimensions. A punchthrough diode can be realized simply as a gap in semiconductor "wiring." The CCD is a close relative of the MOSFET, is equally self-isolating in 3-D. In large 3-D arrays it will have significant applications for image processing.

In applications where large numbers of identical building blocks are used, these building blocks will be positioned in a regular array. The art and science of crystallography has identified fourteen ways to arrange points in space so that each has the same arrangement of neighboring points. Each of these unique arrangements is known as a space lattice. Our memory cells, for example, can be positioned at sites defined by any of the fourteen space lattices. While the orthogonal case, involving only right angles, will often be used, some oblique cases may bring advantages by positioning each new cell in a fresh crystal region.

Broad areas of application include digital, analog, image-processing, and neural-network circuits and systems.

Memories for supercomputers are an important digital application of monocrystalline 3-D circuits. Our 3-D concepts will greatly improve the performance and accessibility of the bulk memory, and at the same time optimize cache-memory architecture. The problems of making necessary connections from one cell to another, whether the connection is a power bus, a clock line, or a signal path, all are matters of connectivity, and these are greatly benefited by 3-D architecture.

Three-dimensional organization sharply increases volumetric functional density over that of the 2-D case, and reduces average line length, thus improving performance. Such a memory will be far less vulnerable to environmental factors, such as vibration, than is the conventional electromechanical mass-storage system. Signal propagation time even just within the bulk memory can be of serious concern. Shrinking overall system dimensions through the 3-D density advantage will bring significant shortening of necessary paths. Also the effect of "off-chip" parasitic loading on transmission time will be much smaller because functional blocks have higher content. Skew in signal arrival time causes soft errors that are difficult to pin down, and hence, serious degradation of reliability, avoided in the 3-D case.

Most supercomputers are called upon to provide concurrent access to a number of users, accomplished by providing cache memories. An ideal cache memory is adequately large, adequately fast, and close to its processor. All of these cache-memory features will benefit from 3-D architecture. Supplanting both kinds of prior-art memories by 3-D implementations will permit expansion of access at low cost in signal dispersion. The greater ease of access imparted by 3-D structure can be illustrated by pointing out that it permits reading out data a page at a time, rather than a line at a time. Furthermore, the 3-D memories will be free of the vulnerabilities of today's electromechanical mass-storage systems.

Error correction relies on examination of entire blocks of data. Large blocks means high correction efficiency. But all bits of a block must be available concurrently, and again 3-D accessibility is of paramount importance. In a 3-D store, parity checking along two or more axes becomes possible, for correcting soft errors and even burst errors.

In analog electronics, a major advantage will come from replacing 2-D crossovers by 3-D bristleblock interconnections. The reduction of crosstalk will diminish the incidence of parasitic oscillations, greatly improving op-amp performance.

Neural networks cannot be realized at all without 3-D methods. Although the principles and functioning of the brain are still not well understood, some features are becoming clearer than they were just a few years ago. The brain relies on massive parallelism and copious cross-coupling among some $10^{12}$ neurons. The simplest current model for a neuron is a summing amplifier with some $10^4$ inputs derived from multipliers. Each neuron has associated with it perhaps ten "glue-logic" cells. Only the high functional density and the routing freedom of 3-D technology will be able to emulate the structure and performance of nature's 3-D network system.

One significant aspect and feature of the present invention is a monocrystalline three-dimensional integrated circuit which includes optimized path lengths, functional density and reliability.

Another significant aspect and feature of the present invention is an isolating box incorporating an orthogonal isolator for the semiconductor component or components. The orthogonal isolator can also include floating elements between its major members.

A further significant aspect and feature of the present invention is a device structure that places layers of critical profile normal to the growth axis, the growth axis being identified as the "x" axis.

An additional significant aspect and feature of the present invention is a 3-D IC which lends itself to continuous or quasicontinuous processing.

Other significant aspects and features include the use of silicide in a thin layer as an ohmic contact and/or in a thicker region as a conductor. The silicide conductor can also be insulated. Many combinations of thin layer, thick regions and/or insulators can be combined providing for a monocrystalline integrated circuit.

Having thus described the embodiments of the present invention, it is the principal object hereof to provide a monocrystalline three dimensional integrated circuit. Another principle object is the use of silicide for an ohmic contact in a thin layer or as a conductor in a thicker region.

Objects of the present invention include a monocrystalline three-dimensional integrated circuit including a three-dimensional doping pattern, forming varied devices and circuits that may be insulator-insulated or junction-isolated and with interconnecting signal paths and power buses, that may be insulator-isolated or junction isolated, and may include tunnel junctions or metallic layers as ohmic contacts from N-type to P-type regions. The semiconductor crystal also may include isolating boxes incorporating orthogonal isolators. The semiconductor structure places layers of critical profile normal to the growth axis. The orthogonal isolator can also include floating elements. When the semiconductor device employed is the JFET, it can also include an internal gate or gates. There can also be box isolation of the internal-gate devices. Further, there can be pinch-off isolation, at the edge of an internal gate, involving an internal gate thin enough so that the region between the upper and lower channels is normally depleted, as well as orthogonal isolation of the gate edge using U-shaped cross-section regions of same type as channel regions wrapped around the gate-channel edges to provide orthogonal isolation. The semiconductor monolith can also be provided with a coaxial conductor or with one or more conductors within a larger conductor, where here and in the following discussion, "conductor" is construed to mean a heavily doped semiconductor region that simulates metallic properties or an actual metallic phase. The semiconductor monolith lends itself to specific three-dimensional circuit embodiments. The entire semiconductor monolith can be made through a continuous processing or quasicontinuous processing procedure.

DESCRIPTION OF THE PREFERRED EMBODIMENTS

Figure 1:
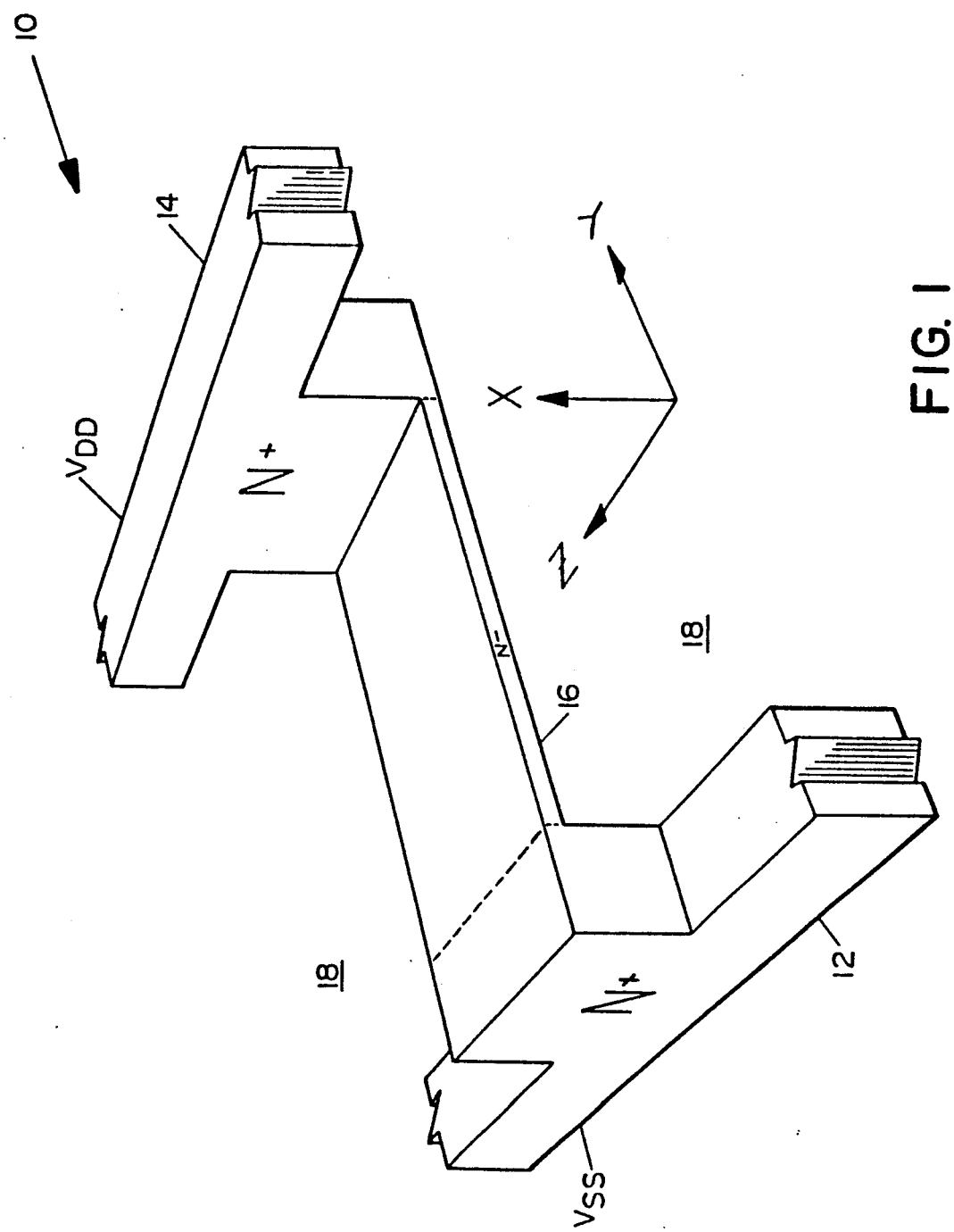
FIG. 1 illustrates a perspective view of a field effect diode.

FIG. 1 illustrates a perspective view of a current-regulating diode device 10 connecting to N+ −region conductors 12 and 14. A thin N− region 16 is the channel of the device 10. All of these N-type regions 12-16 are surrounded by a matrix of P− material 18, treated as invisible for sake of brevity and clarity in the figure.

All space is P-matrix material, except for those regions which have been numbered. The N+ region 14 is connected to $V_{DD}$ and the N+ region 12 is connected to $V_{SS}$. The elements 12 and 14 can also be referred to as conductors. With voltage applied as indicated, the upper N+ region 14 is isolated from the matrix by a reverse-biased junction, that reverse-biased junction being wherever the region 14 comes into contact with the surrounding P region. The same is applicable to the channel region 16 with reverse bias diminishing as the lower conductor 12 is approached. The largest reverse bias is in region 14, while the smallest reverse bias is at region 12. The device 10 is structured so that the layers having a critical profile are placed normal to the growth axis x.

Figure 2:
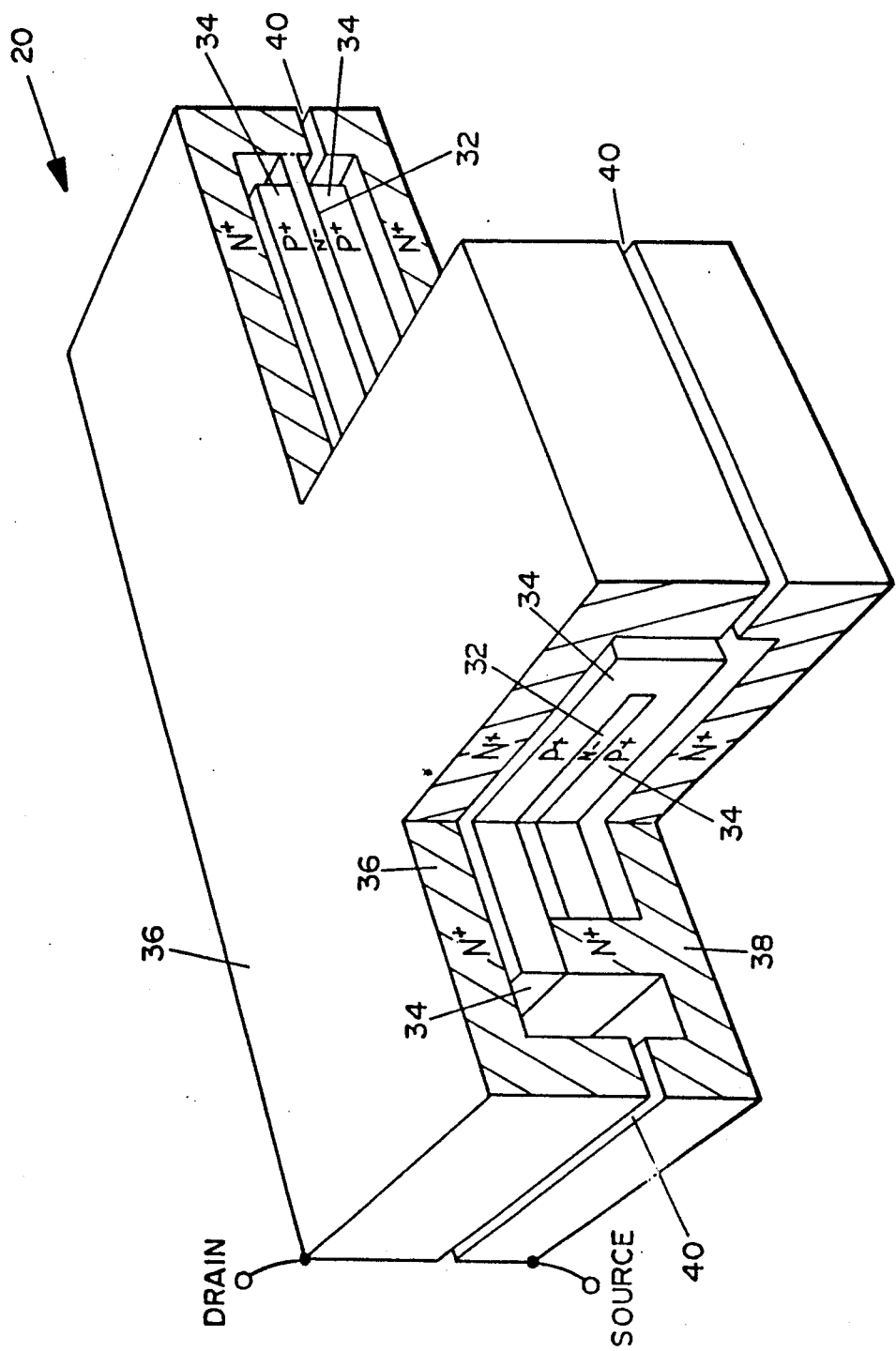
FIG. 2 illustrates a perspective cutaway view of a field-effect diode load device useful in monocrystalline three-dimensional integrated circuit (M3DIC)

FIG. 2 illustrates a perspective cutaway view of a monocrystalline, 3-dimensional integrated device 20, configured as a field-effect diode load device. An N-channel 32 is surrounded by a gate 34 of P+ material. The regions 32 and 34 are also continuous towards the right-hand side of the figure. The regions 32 and 34 are the active parts of the device. The active part of the device is isolated by the top part of the box, N+ material 36 and the bottom part of the box, N+ material 38. The N− material 32 connects the lower portion of the box 38 to the upper portion of the box 36. The N+ layers of material 36 and 38 form the isolation box. Gaps 40, which are continuous about the device, provide for orthogonal isolation. The layers 32 and 34 are suspended within the box and surrounded by P matrix material which has not been labeled on the figure for purposes of clarity and for the sake of brevity in the figure.

Figure 3:
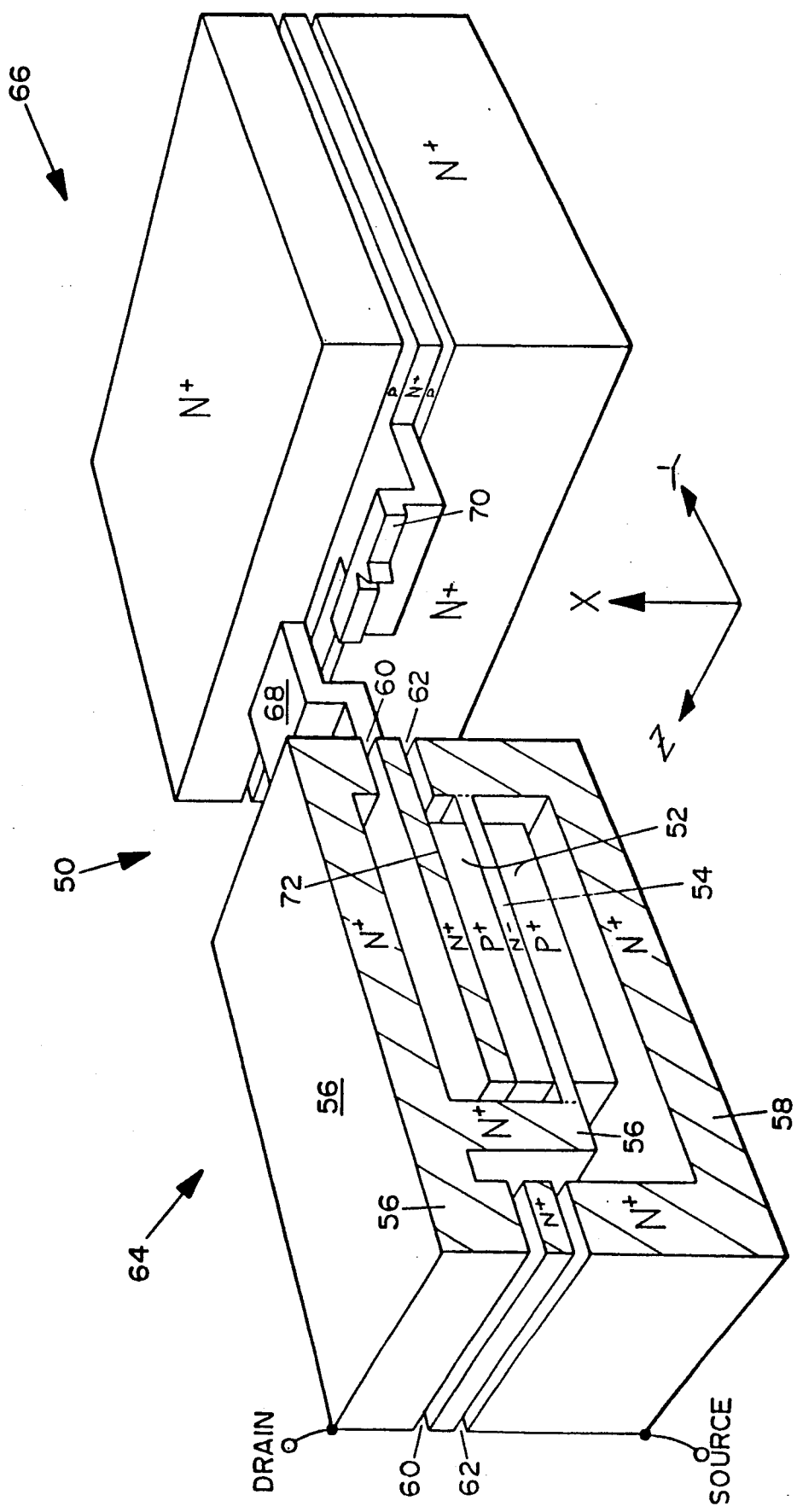
FIG. 3 illustrates a perspective cutaway view of a cross-coupled E-mode JFET pair.

FIG. 3 illustrates a perspective view of a pair of cross-coupled E-mode JFETs partially cut-away. Reference will be subsequently made to FIG. 4 of an Eccles-Jordon flip-flop constructed of enhancement-mode and depletion-mode JFETS. If the P+ region were extended out of the paper, the P+ region 52 would wrap around the end portion of the N− region 54. In this particular embodiment, two gaps are provided, 60 and 62, which provide for penetrating through the box wall for the cross-coupling elements 68 and 70. P matrix material fills the gaps and has not been illustrated for purposes of clarity and brevity in the figure. The left-hand box 64 of FIG. 3 represents transistor E1 of FIG. 4, and the right hand box 66 of FIG. 3 illustrates the right-hand transistor E2. The layers 68 and 70 provide for cross-coupling accordingly. The junction of the N+ and P+ layers represents a tunnel junction 72. Cross-coupling elements 68 and 70 represent interconnecting signal paths. The FIG. particularly shows layers of critical profile normal to the growth axis X. End layers 56 and 58 illustrate the isolating box, as well as the N+ layers of the left-hand side of FIG. 3.

Figure 4:
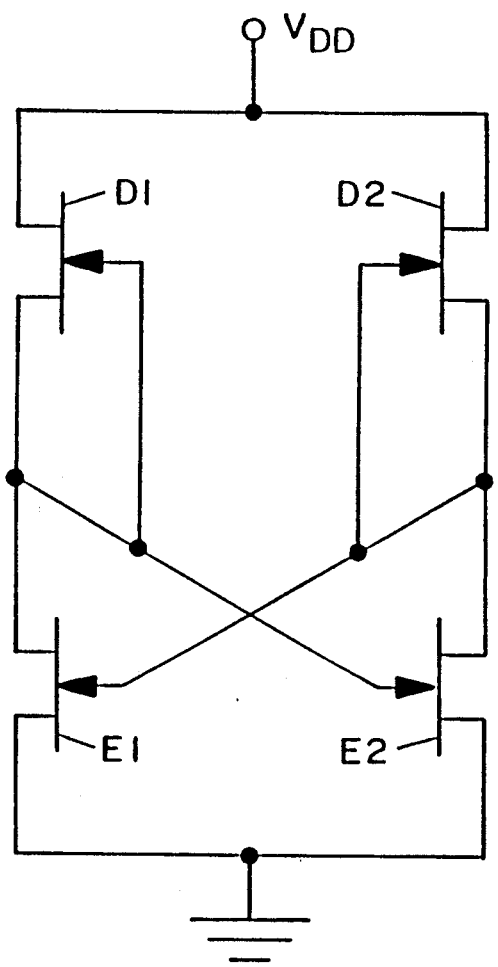
FIG. 4 illustrates an Eccles-Jordan flip-flop constructed of enhancement-mode and depletion-mode JFETS.

FIG. 4 illustrates the electrical circuit schematic for an Eccles-Jordon flip-flop constructed of enhancement-mode JFETs, E1 and E2, and depletion-mode JFETs, D1 and D2. FIG. 3 represents the physical embodiment of the two E-mode JFETs, E1 and E2, in FIG. 4 where all numerals correspond to those elements previously described. The devices of FIGS. 1-4 can be constructed by a single process and within a single processing vessel.

In operation, multilayer JFET-channel devices for the purpose of achieving high transconductance are particularly advantageous because the x dimensions in the isolating box are only slightly increased by increasing the number of channel layers.

Additional features of the devices can include doped regions which consist of a plurality of fractional atomic planes of dopant atoms which can be deposited through a shadow mask. The structure lends itself to a minimal number of metal-semiconductor and dissimilar-material interfaces which are required to implement a desired structure. Of course, all critical dimensions are normal to the growth axis. Junction isolation is provided by the arrangement of the materials themselves. Tunnel junctions as ohmic contacts are provided from N-type to P-type regions. When upper and lower gates are common in an enhancement-mode JFET, the device is useful as a driver. In a JFET with upper and lower gates independent of each other, the punch-through voltage from gate to gate yields a constant-voltage I-V characteristic, useful for level shifting in the M3DIC. In the third, or orthogonal-isolator application, there must be a high enough punch-through voltage in the JFET so as to provide useful gate-to-gate isolation below that value, while simultaneously providing source-to-drain isolation in the orthogonal direction through the normally depleted channel, which provides the orthogonal isolation. A floating element can be introduced into the JFET channel region and between the gate regions, thus increasing the punch-through voltage and thus providing a greater isolating voltage. A JFET with one or more additional floating elements introduced into the channel region and between the gate region, increases the punch-through voltage and thus the isolating voltage. When such a JFET is incorporated into an isolating box that surrounds at least one component of the M3DIC in such a way that one gate is common with the box lid and the other gate is common with the bottom of the box, the dual-gate E-mode JFET is continuous around the periphery of the box, thus achieving simultaneous top-to-bottom isolation and inside-to-outside isolation. When there is at least one additional element lying between the gates and extending around the entire periphery of the box of the JFET, it is thus possible to provide a direct connection of an element inside the box to an element outside the box without loss of the orthogonal isolation.

In an internal-gate JFET, the channel surrounds the gate region, or lies on both sides of it. In a JFET with a gate region between two channel regions, two regions of the same-type material as the channel wrapped around the side edges of the channel-gate structure can provide for orthogonal isolation of the gate region from the surrounding matrix, while also enabling the gate to modulate the conductivity of the entire channel. This is referred to as edge isolation. Another form of edge isolation is called pinch-off isolation. In this case, the gate is thin and the two channel layers extend laterally beyond it, with complete depletion existing between the extending channel layers so that the gate region is isolated from the matrix.

All-depletion-mode circuits can include level shifting by providing a gap in a conductor so that the punch-through phenomena will occur by E-mode devices. The E-mode JFET structure lends itself particularly to orthogonal isolation, exhibits punch through for voltage regulation and level shifting, and provides that the device can be used as an E-mode JFET driver.

Figure 5:
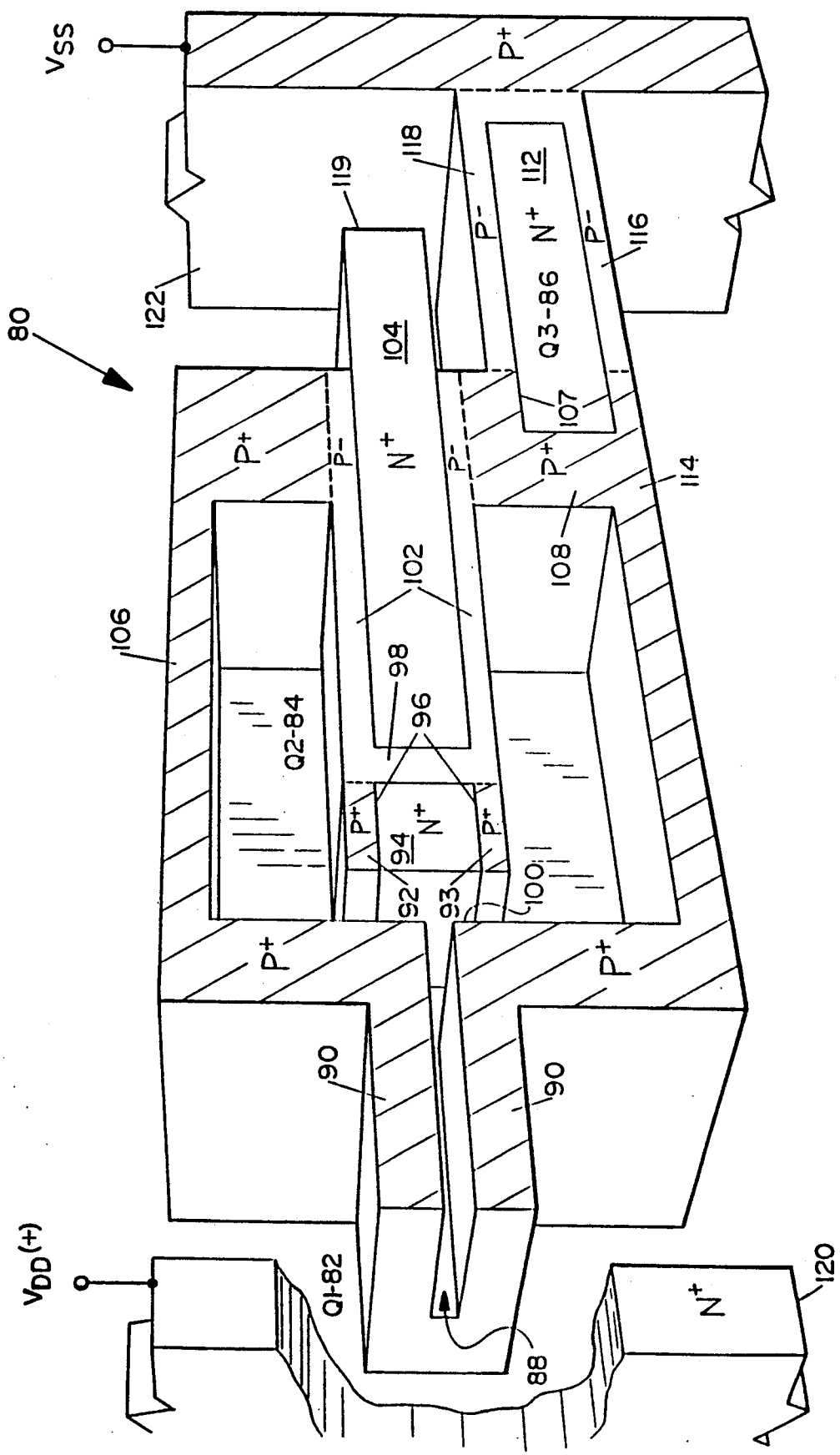
FIG. 5 illustrates a perspective cutaway view of a complementary JFET bistable circuit.
Figure 6:
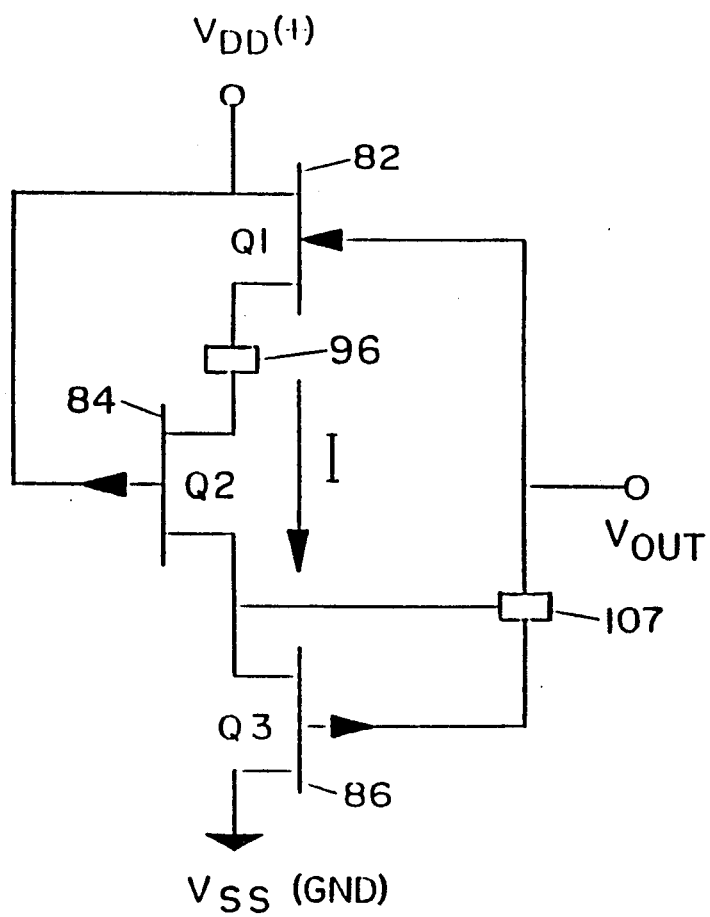
FIG. 6 illustrates a circuit diagram of FIG. 5.

FIG. 5 illustrates a perspective cutaway view of a negative-resistance memory cell 80 without the read or write capabilities. The cell 80 corresponds to the electrical circuit of FIG. 6. The cell 80 includes three different transistors Q1-82, Q2-84, and Q3-86. Transistors Q1 and Q2 form a negative-resistance pair. Transistor Q3 is a depletion-mode load device. This, contrary to the previous figures, illustrates an N-type matrix where the N-type material is invisible for purposes of clarification and sake of brevity in the drawing. The N channel 88 of Q1 is surrounded by P region 90 which is continuous and is symmetric in the plane in which it is cleaved. The P+ regions 92 and 93 and N+ region 94, respectively, illustrate tunnel junctions as ohmic contacts. The tunnel junctions 96 are illustrated in FIG. 6. The N+ region 94 is common with the N material inside of the box of Q2. Region 98 corresponds to the source of Q2. The end of the channel, as well as the region about 100, corresponds to the source of transistor Q1. The thin channel 102 is the active part of transistor Q2 and illustrates the internal gate of Q2. N+ region 104 is an internal gate. A thin P-type region 102 surrounds the N+ region 104. P material 106, a continuation of P material 90, forms a box about the P+ 92, N+ 94 and the N+ 104 material accordingly. The box is designated as 106, but is not shown in totality for purposes of illustration and clarity in the drawings. The region of the P material 90 which surrounds the channel 88 is the gate of Q1. A tunnel junction 107 is formed by the P+ 108 region and the N+ region 112. The gate region 112 is electrically common to a drain region 114 through the tunnel junction, and through the path of P+ 108 and N+ 112 through the tunnel junction 107. The P− region, including channels 116 and 118, wraps around and surrounds the internal gate 112. The end of N+ region 104, that end designated as 119, is at the same potential as a power bus 120, that potential being $V_{DD}$. The P+ region 122 is a bus region. The regions 92 and 94 can be grown side-by-side in lieu of the stacked configuration as illustrated in the figure.

FIG. 6 illustrates a circuit diagram of FIG. 5 where all numerals correspond to those elements previously described.

Figure 7:
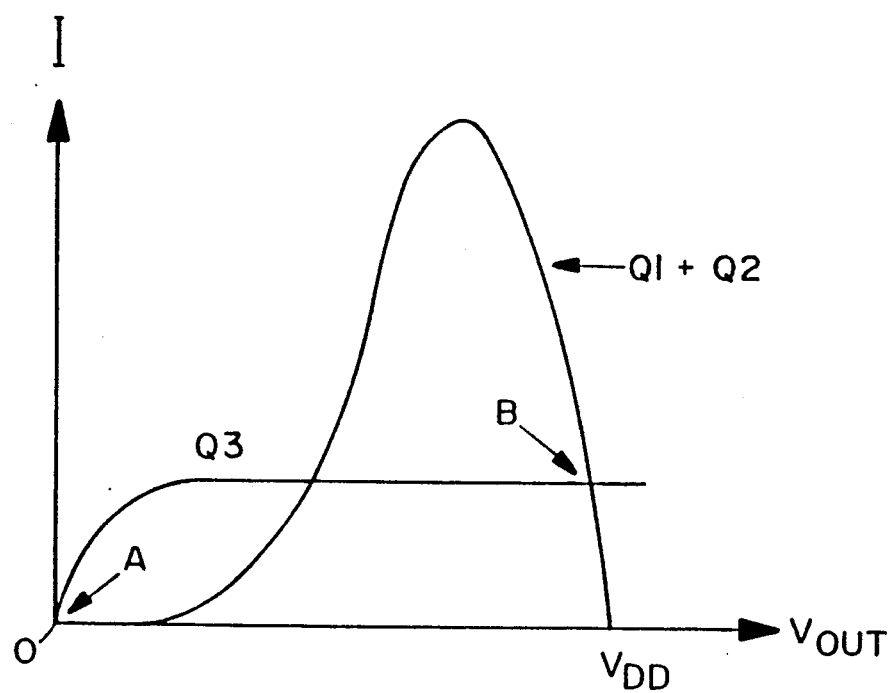
FIG. 7 illustrates an I-V plot of FIG. 6.

FIG. 7 illustrates an I-V diagram of the operation of FIGS. 5 and 6. Points A and B are the voltage-stable points for the circuit.

Figure 8:
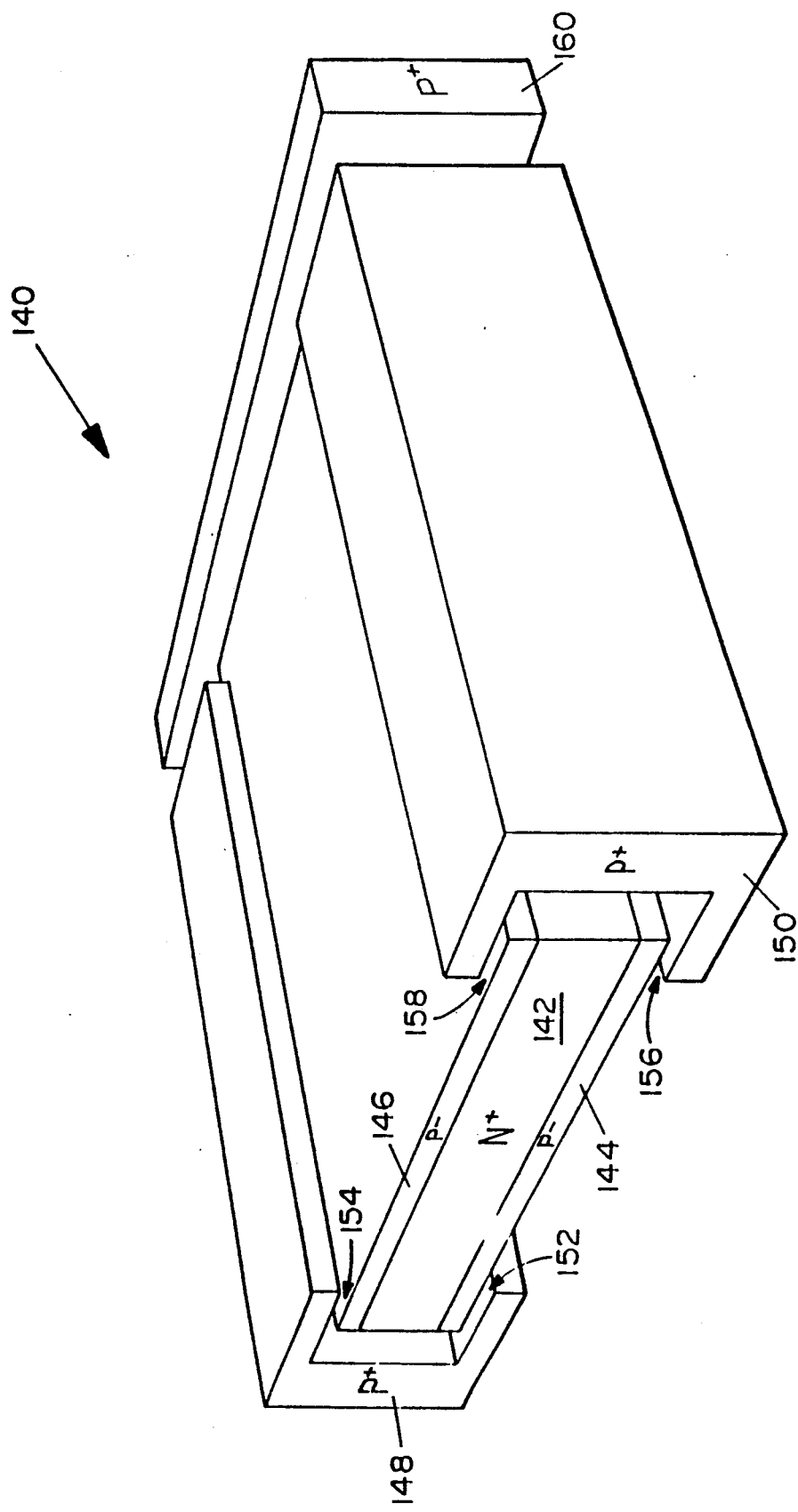
FIG. 8 illustrates orthogonal isolation of a channel edge in an internal-gate device.

FIG. 8 illustrates a perspective view of orthogonal isolation of gate and channel edges in an internal-gate device. An internal-gate JFET 140 includes a gate internal to a channel. The gate 142 is flanked top and bottom by channels 144 and 146. Members 148 and 150 isolate the edges of the gate 142 and channels 144 and 146 accordingly. A plurality of gaps 152, 154, 156, and 158 are provided accordingly. Member 160 connects to the drain ends of the channels. The entire device is surrounded by N− material. The P− regions 144 and 146 and P+ regions 148 and 150 connect to the source. The structure of FIG. 8 is intended to substitute for elements 102 and 104 of FIG. 5 accordingly.

Figure 9:
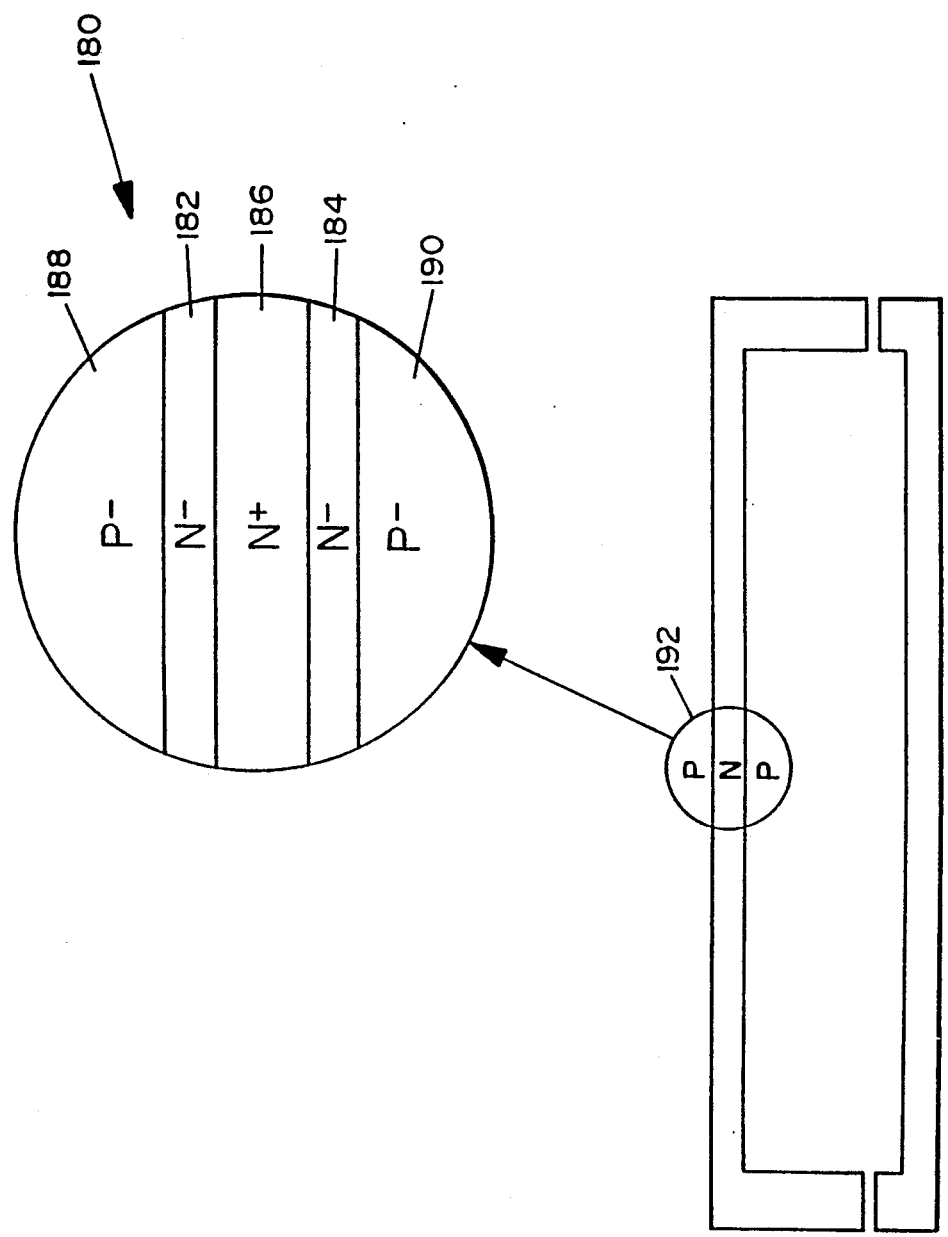
FIG. 9 illustrates a wall-structure variation for diminishing the parasitic capacitance of isolating box junctions.

FIG. 9 illustrates a cross-sectional view of wall structure variations for diminishing parasitic capacitance of isolating-box junctions. The variation 180 includes additional N− layers 182 and 184 above and below the N+ layer 186. The N− regions are surrounded by P− regions 188 and 190. The variation 180 would be substituted in lieu of the P−, N+, and P− region structures 192. The N− regions reduce capacitance while increasing the thickness of the depletion region. The structure of FIG. 9 is intended to replace elements 56 and 58 of FIG. 3 accordingly.

MODE OF OPERATION

The JFET devices of the present invention are described as within a single-crystal semiconductor monolith containing a three-dimensional doping pattern, and also referred to as a monocrystalline three-dimensional integrated circuit (M3DIC). The devices or circuits can be utilized as gate-array devices when put into a three-dimensional array. Further, the devices or circuits can be used in memory applications accordingly.

The vertical dimensions of the devices may be much smaller than the lateral dimensions. It is advantageous to route as many interconnections vertically as possible. Consequently, signal-path lengths are reduced and cross-sectional area of the vertical interconnections can be larger than that of the horizontal connections. This, therefore, minimizes the RC time constraints associated with the connection paths.

A typical arrangement would feature cells with a high degree of interconnectivity stacked vertically upon each other, and connected by highly doped semiconductor or metallic-phase conductor regions. Long interconnections, as well as global lines, such as for clocks and buses, could be distributed by metal lines on one or more surfaces of the semiconductor monolith. This is in line with the teachings of the original integrated circuit, where metal occurs only external to the monolith. Metal may be provided for making connections to external circuitry.

The M3DIC technology is invaluable for achieving required storage capacity which is attained quite easily. As an example, let the weighted dimensions (weighted to account for peripheral circuitry) of a memory cell be $20 \ \mu m \times 20 \ \mu m \times 10 \ \mu m$, with the latter being the X or growth direction. This provides $2000 \times 2000 \times 4000 = 16 \times 10^9$ cells in a cube 4 cm on the side.

There is more than sheer capacity. Note that, as far as addressing goes, main memories are of the random-access type while the bulk variety is invariably sequential in nature. This simplifies the example considerably.

Figure 10:
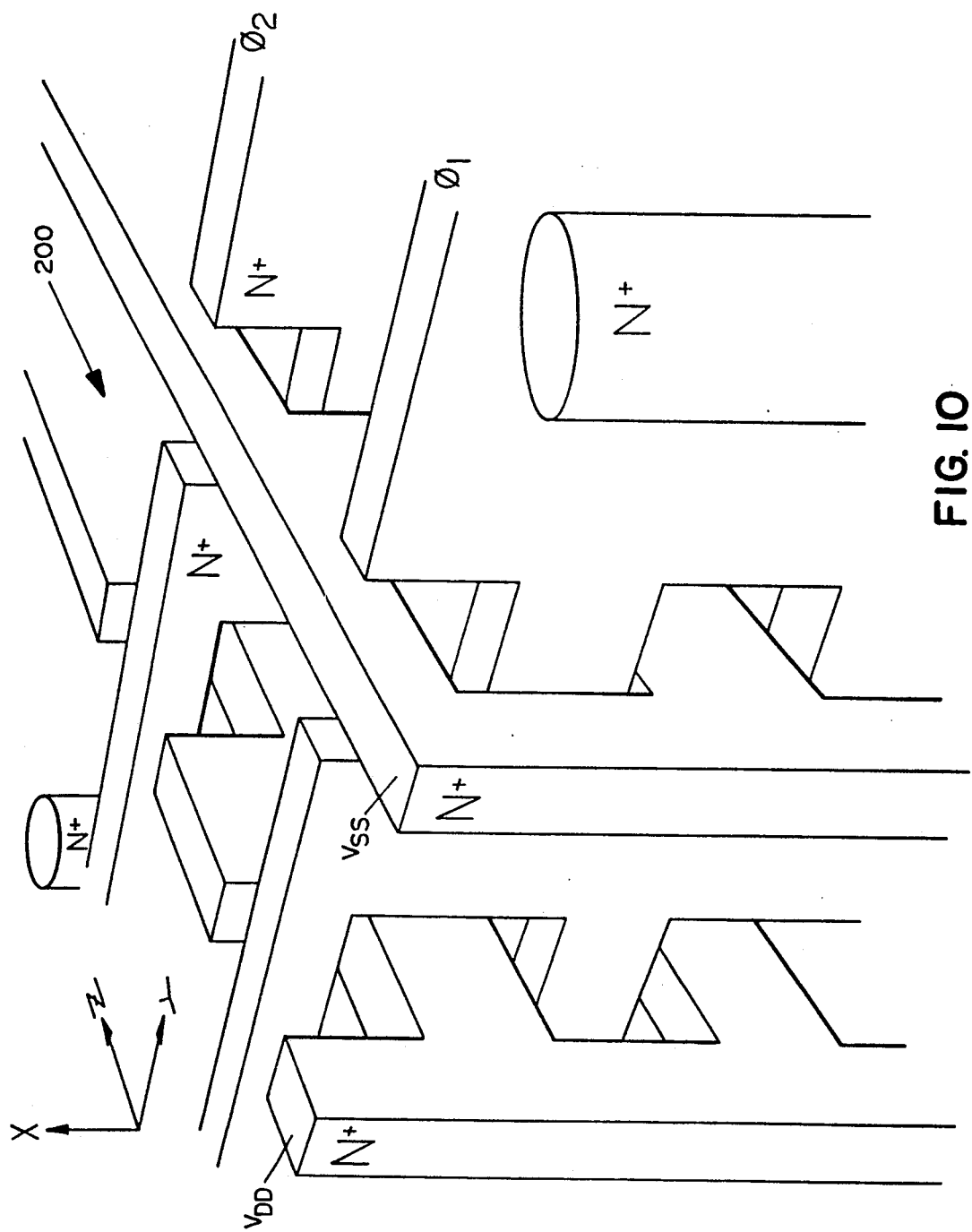
FIG. 10 illustrates a monocrystalline three-dimensional integrated circuit memory (M3DICM)

FIG. 10 illustrates a 3-D memory which can be organized as a large array of shift-register pipes with only two supply lines (the lines being actually "planes") and the two lines (also being "planes"). Looking at an array from the top, as along the X axis in FIG. 10, one sees one plane of cells and the four buses. Naturally, in three dimensions, there need not be any space conflict among the buses.

Another advantage is where speed is very imprtant. Referring to bulk memories, there are two time constants. One corresponds to the rate at which bits are actually read or written. The other called latency gives the adverage time it takes to access the required sector. Both are shortened by the 3-D implementation to an order-of-magnitude extent, the first because transistors are much faster than their magnetic counterparts, and the second because access to "pipies" is much simpler than access to "sectors" on a disk.

Taking reliability as a further advantage, there is substantial elimination of microphonics. That in itself makes 3-D integrated circuits unique in bulk storage. For airborne applications and, indeed, in any vibration-prone environment, solid state is the preferred stucture.

Data are transferred from "bulk" to "main" memory in blocks. That is why sequential access within bulk is perfectly accptable. while time is associated with the relatively frequent swaps, a substantial reduction accrues from, for example, GaAs 3-D , because of the ability of GaAs to convert electrical to optical energy. The transfer of data from the "bulk" to "main" memory could be direct, the main memory being mounted on the output face of the bulk memory or, such as through fiber-optic links. A structure with a slot for main memory or peripherals to permit optoelectronic transfer on Input and Output can also be provided. The M3DIC memory converts a maze of circuitry into regular arrays and, thereby, reduces the length and time of travel. This also creates additional naturally intersecting planes for parity checks. The M3DIC alleviates the problems of resistance and voltage drop in power and signal lines because of facilitating fabrication of thicker elements on one hand while reducing distances measured in numbers of squares or cubes on the other.

The $V_{DD}$, $V_{SS}$, $\phi_1$ and $\phi_2$ "planes" of FIG. 10 can be relatively thick to give low sheet resistance. Any point within the cube is no more than a couple of squares away from any input point. In a two-dimensional IC, it is topologically convenient to check parity in a row and column, and a wrong bit at the intersection of the two can thus be corrected. If multiple errors exist in a row or column, however, such cannot be detected unless parity is also checked in an additional dimension. In 2-D this is difficult. In the M3DIC, many more physically-aligned-cell directions exist in which parity can be checked.

In a three-dimensional array of monocrystalline memory cells, the cells can be positioned at sites defined by a space lattice of the crystallographer, which can be by way of example and for purposes of illustration only, but not to be construed as limiting of the present invention, a space lattice of cubic, orthorhombic, monoclinic, triclinic, or other spatial variations thereof. The memory cells provide for checking parity for error detection along lines of physically adjacent cells, where the lines have direction defined by the three primitive vectors of the space lattice involved. This can be pairs such as x-y, y-z, or x-z, by way of example and for purposes of illustration only. Additional direction of checking for parity can also be undertaken. The memory cells can contain parallel layers of a hevily doped semiconductor of a first conductivity type situated in a more lightly doped matrix of a second conductivity type where regularly positioned perforations or openings in the heavily doped layers provided for passage of other conductors through in other directions, such as illustrated in FIG. 10. The semiconductor bulk-storage medium is faster, smaller, lighter and less sensitive to environment than the prior electromechanical media.

The memory can be provided with an output face for the mounting of a computer main memory. The memory can also include optoelectronic links for mounting on main memory or peripheral subsystems of the main memory. The memory can also include a processor attached to one face, where the processor may include a small main memory. The memory lends itself to be fabricated as a signal unit an all-semiconductor monolith for total-system integration. The memory cell can consist of two E-mode JFET drivers, cross-coupled, and two D-mode JFET loads. The memory cell can also consist of two complementary JFETs, connected to form a negative-resistance pair in series with a load device. The memory can also consist of eight D-mode JFETs and two level-shifting diodes. The memory can also consist of six D-mode JFETs and three voltage-regulating diodes connected in a current-switching configuration.

MONOCRYSTALLINE THREE-DIMENSIONAL INTEGRATED CIRCUIT DEVICES

A monocrystalline device can include combinations of the following four components as set forth in Table 1 below.

MONOCRYSTALLINE COMPONENTS

Table 1

1. Semiconductor monolith as described in FIGS. 1–10;
2. Thin monocrystalline silicide layer for an ohmic contact, a thin layer being described as a few monolayers with a monolayer amounting usally to a few angstroms;
3. Thick monocrystalline silicide region as a conductor, a thick layer described as a few tenths of a micrometer or more than five hundred angstroms; and,
4. Monocrystalline insulator such as calcium fluoride or like material.

The combinations of components of Table 1 include the following as set forth in Table 2 below.

COMBINATIONS OF TABLE 1 FORMING MONOCRYSTALLINE DEVICES

Table 2 a—1
b—1 and 2
c—1 and 3
d—1 and 4
e—1, 2 and 3
f—1, 2 and 4
g—1, 3 and 4
h—1, 2, 3 and 4

Figure 11:
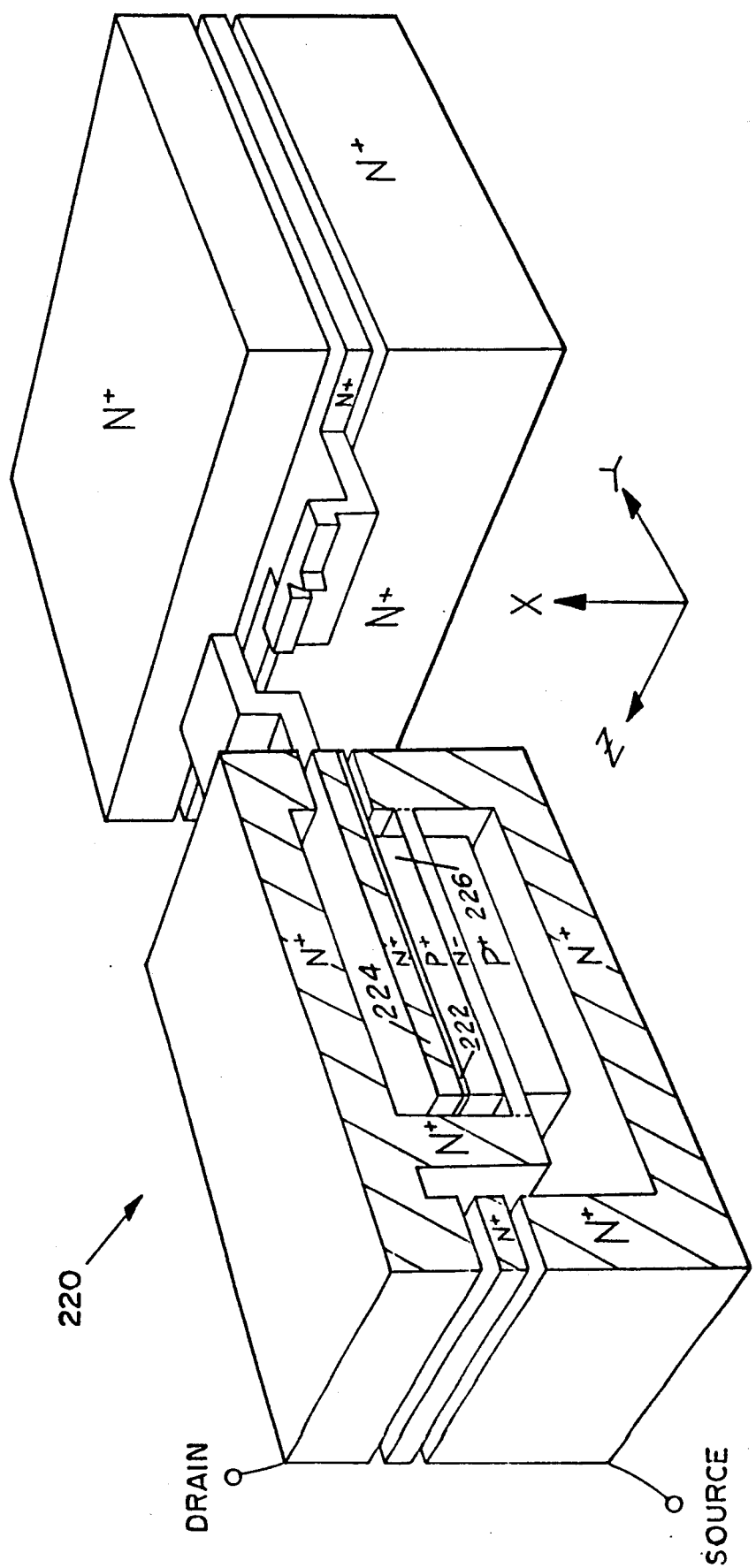
FIG. 11 illustrates a monocrystalline device with a silicide layer as an ohmic contact.

FIG. 11 illustrates a perspective cutway view of a 3-D device 220 with a thin silicide layer 222 or like material as an ohmic contact. The layer 222 is positioned between an N+ layer 224 and a P+ layer 226. The structure is referred to as a monocrystalline 3-D IC device. The remaining structure components are those as previously described in FIG. 3. The metallic inclusions employed in single-crystal form to achieve a low-resistance ohmic contact between N-type and P-type regions (probably heavily doped) can provide significant advantages. A key property of a silicide region in such an application is the thickness of the metallic layer necessary to achieve the desired result. If thin sections are adequate, then no step problem is engendered. Plane growth surface are favored. If junction isolation is being used, the metallic ohmic contact poses no problems because the ohmic contact can be given an internal location, away from the isolating junction.

Figure 12:
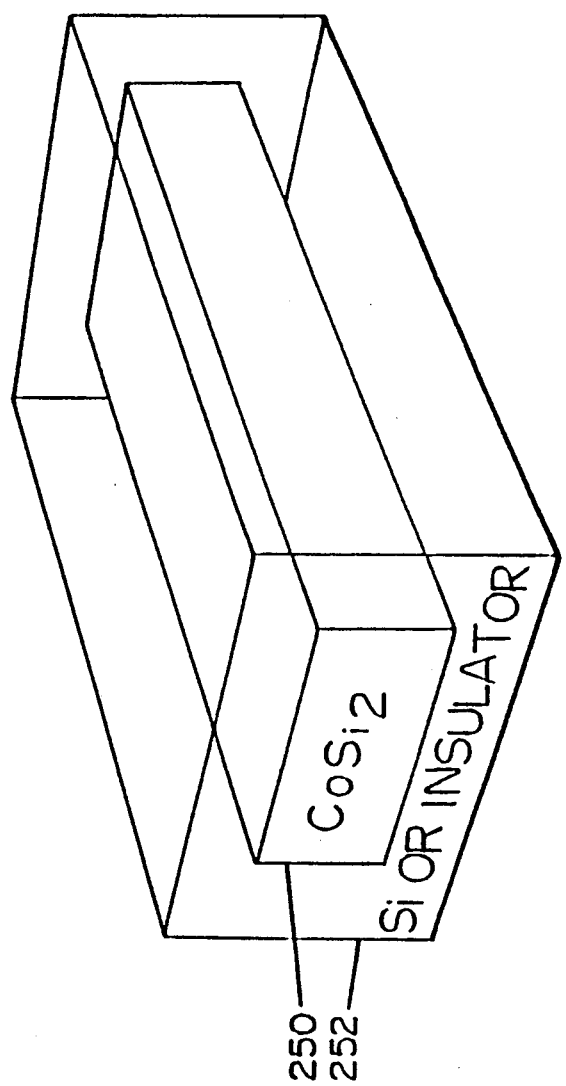
FIG. 12 illustrates a perspective view of a silicide layer as a conductor surrounded by an insulator; and, FIG. 13 illustrates an insulator surrounding a monocrystalline 3-D IC device.

FIG. 12 illustrates a perspective view of a thick silicide region 250 or like material as a conductor which improves conductivity by a factor such as $10^3$. This particular example shows cobalt silicide surrounded by a lightly or heavily doped silicon or insulator 252. Insulators can include calcium fluoride or like insulators.

Using silicides or other metallic phases as conducctors, buses and/or signal paths is advantageous, because the most heavily doped monocrystalline silicon that can be achieved exhibits a conductivity about three decades lower than that of a good metallic conductor. This application, however, raises some concerns. Isolation of the conductor is needed. A Schottky barrier formed between the metallic phase and the surrounding "matrix" is one possibility. If this is not advantageous, the metallic phase could be used as a "core" in a droped-silicon conductor, with PN-junction isolation as originally contemplated. Another possibility would be to use a monocrystalline insulator for isolation.

Another area of consideration is the cross-sectional shape of the conductor. Ideally the cross-section should be circular, to minimize surface-to-volume ratio, thus minimizing parasitic-capacitance-to-conductance ratio. A square cross-section would be next best from this point of view, followed by a rectangular cross-section. All of these considerations involve thick metallic sections, which of course raise the consideration of step formations. Silicon and silicide could, though, be grown side by side at approximately equal rates.

Figure 13:
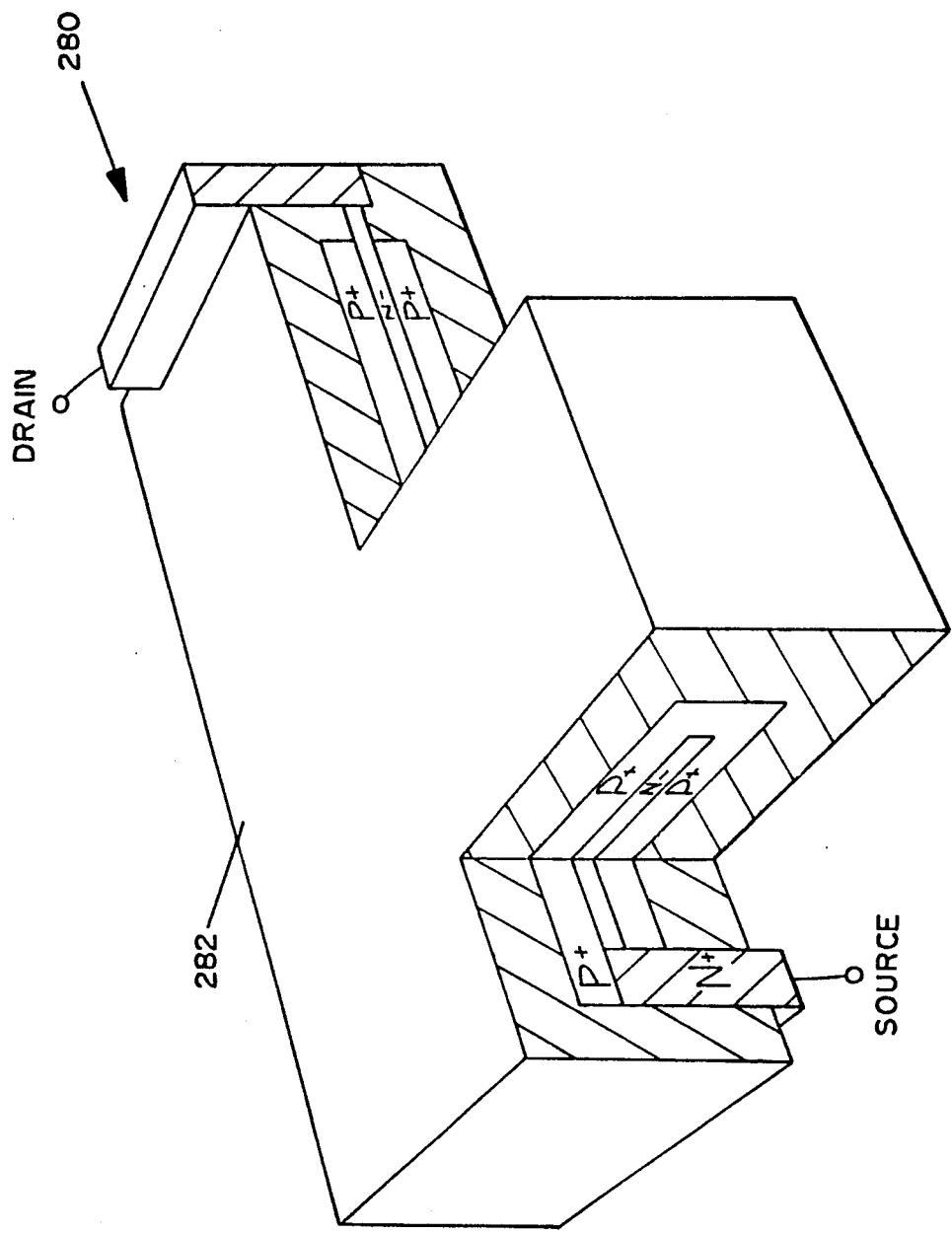

FIG. 13 illustrates a perspective view of a device 280 as a monocrystalline 3-D IC device surrounded by insulator 282 such as calcium fluoride or like material. The insulator is defined as a monocrystalline insulator inclusion. To match a PN juction in capacitance, the insulating section must have a thickness X (Ei/Eg), where X is the junction's depletion-layer thickness, typically a few tenths of a micrometer, Ei is the dielectric permeability of the insulator chosen, and Eg is that of silicon. The use of monocrystalline silicides in silicon structures provides for monocrystalline 3-D structures including a monocrystalline memory cell. Providing the monocrystalline structure with inclusions would provide enhancements with respect to low N-P contacts, low resistance conducting paths and low capacitance isolation. The reliability and thermal conductivity in a monocrystalline monolith are very advantageous as compared to heterogenous structures. The thermodynamic stability of the interfaces between silicon and lattice-matched silicides and/or insulators are far greater than that of interfaces between silicon and amorphous, polcrystalline, or crystallographically mismatched inclusions.

Figure 14:
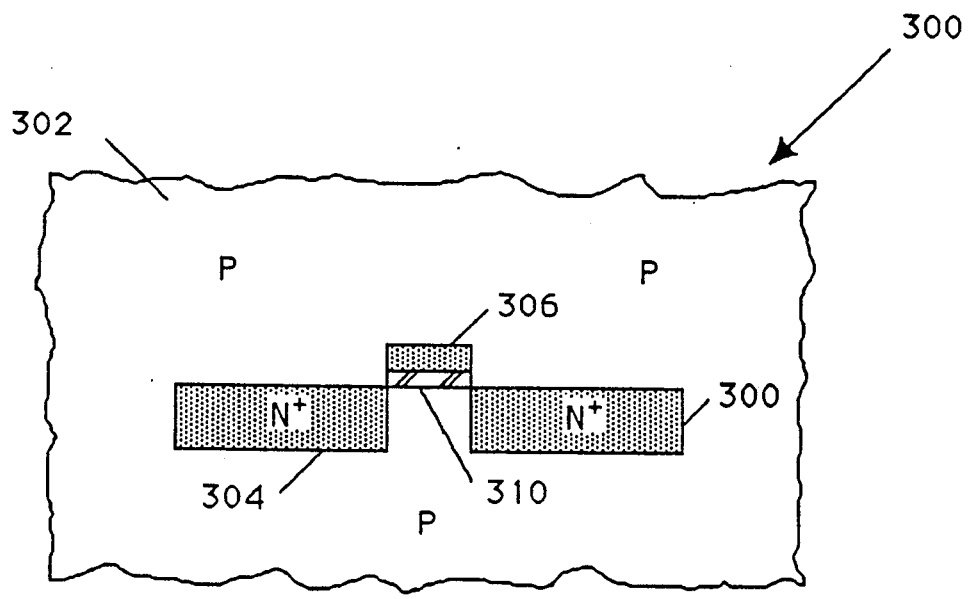
FIG. 14 illustrates a 3-D device of MOSFET-like topology.
Figure 14:
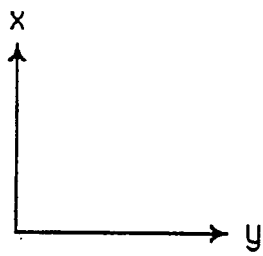

FIG. 14 illustrates in cross-sectional representation a monocrystalline lattice-matched 3-D MOSFET 300 buried within largely P-type semiconductor monolith 302, to which it is also lattice-matched. For illustration we take the semiconductor to be silicon. Such a device of MOSFET-like topology is self-isolating because the P-type matrix 302 is normally kept at the most negative voltage in the circiut, thus causing the P-N junctions 304, 306, and 308 to be either zero-biased or reverse-biased. This representation follows the custom of placing the x axis in a device normal to major junction or interface of the device, in this case the oxide-silicon interface 310. Electrical leads or "wiring" are not shown here, but can be considered to emerge from the device in the z direction, normal to and into the paper. The x direction is usually taken to be the crystal-growth direction. Control voltage applied between the source region, bounded by junction 304, and the field plate or gate electrode, bounded partially by juction 306, causes an inversion layer to form in the P-type silicon at the interface 310. The field plate in this embodiment is heavily doped N-type silicon, like the source region, and like the drain region that is bounded by junction 308. The illustration demonstrates that a device of MOSFET-like topology is as self-isolating in a three-dimensional integrated circuit as it is in a conventional two-dimensional integrated circuit.

Figure 15:
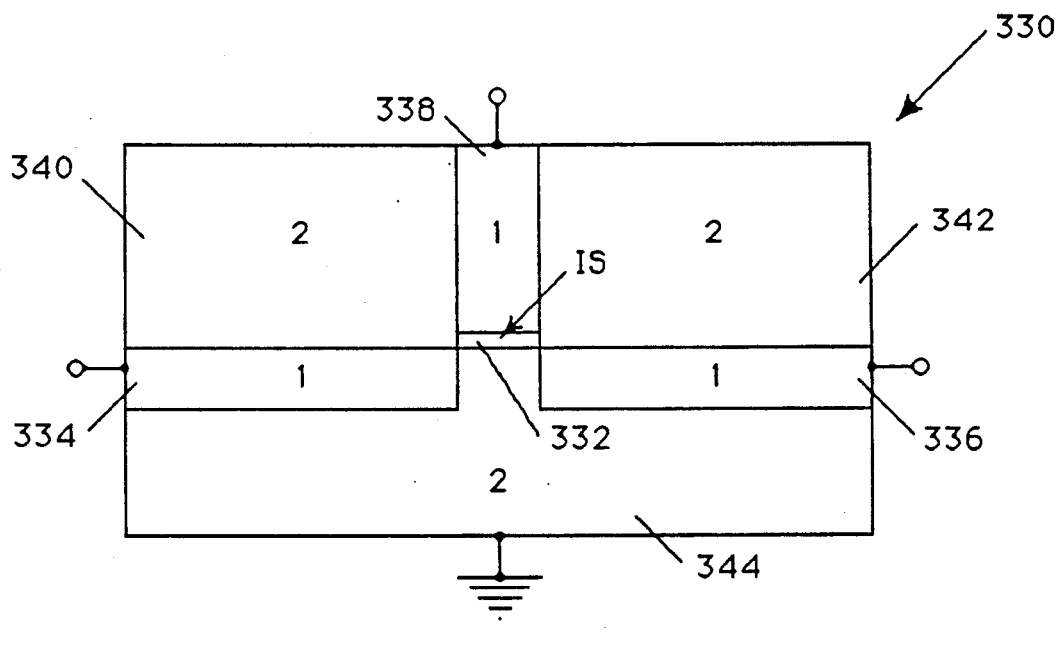
FIG. 15 illustrates a monocrystalline MOSFET of the prior art converted to one 3-D form of the present invention.

FIG. 15 illustrates in cross-sectional representation a monocrystalline lattice-matched 3-D device 330 of MOSFET-like topology in which the gate insulator 332 is insulating semiconductor, a kind of crytsal that can be realized in GaAs technology. Heavily doped type-1 semiconductor is used for the source region and its electrical connection 334, for the drain region and its electrical connection 336, and for the field plate or gate electrode and its electrical connection 338. Lightly doped type-2 semiconductor forms the matrix, or balance of the monolith, comprising regions 340, 342, and 344.

Figure 16:
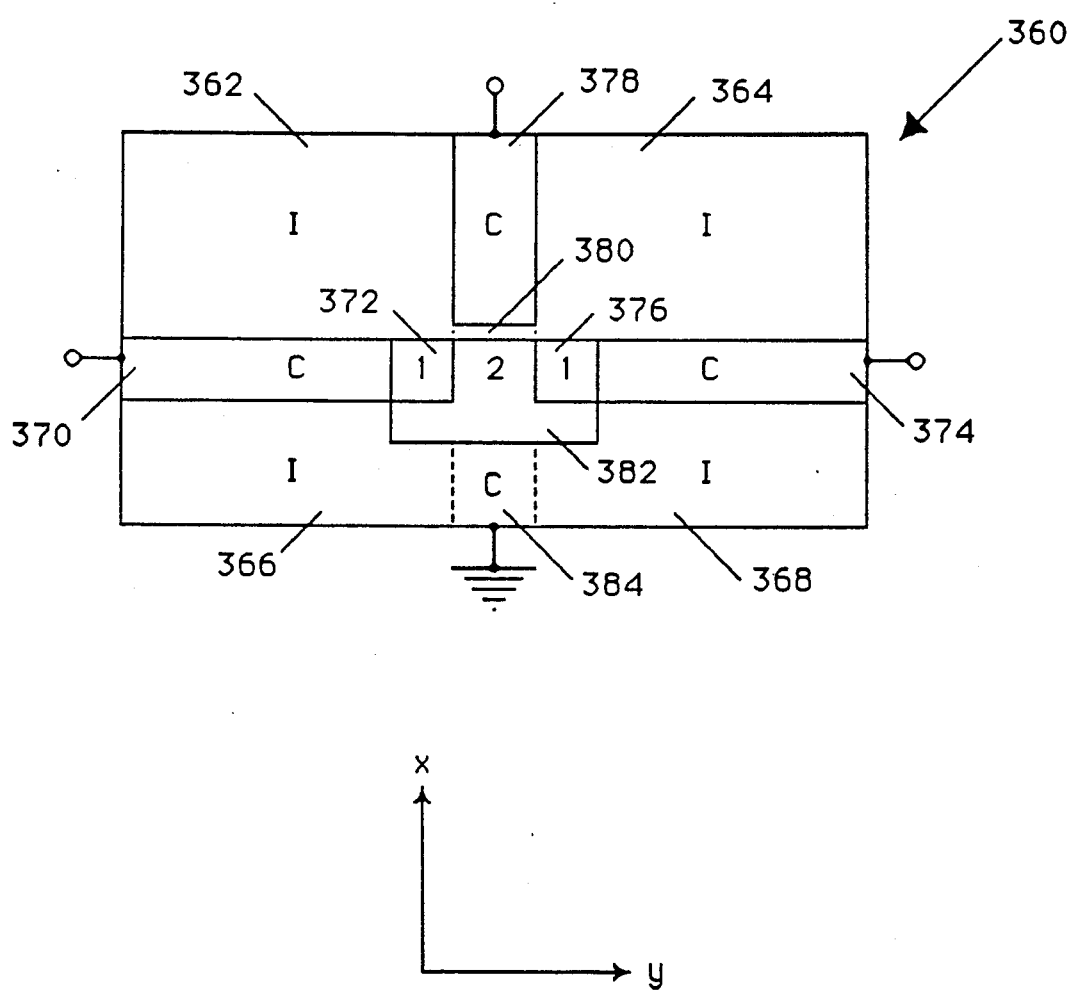
FIG. 16 illustrates a further monocrystalline 3-D MOSFET option.

FIG. 16 illustrates in cross-sectional representation a monocrystalline lattice-matched 3- D device 360 of MOSFET-like topology in which additional structural options are displayed. The matrix this time is a monocrystalline insulator, comprising regions 362, 364, 366, and 368. The source lead 370 is a monocrystalline conductor that makes ohmic contact to a heavily doped type-1 semiconductor region 372. The drain lead 374 is a monocrystalline conductor that makes ohmic contact to a heavily doped type-1 seconductor region 376. A region 378 of monocrystalline conductor serves both as field plate and as the electrical lead thereto. A thin layer 380 between region and a "substrate" region 382 of lightly doped type-2 semiconductor is the gate dielectric of this 3-D MOSFET. An optional conducting region 384 makes ohmic contact to the substrate region 382, for realizing a fully four-terminal MOSFET if desired.

Figure 17:
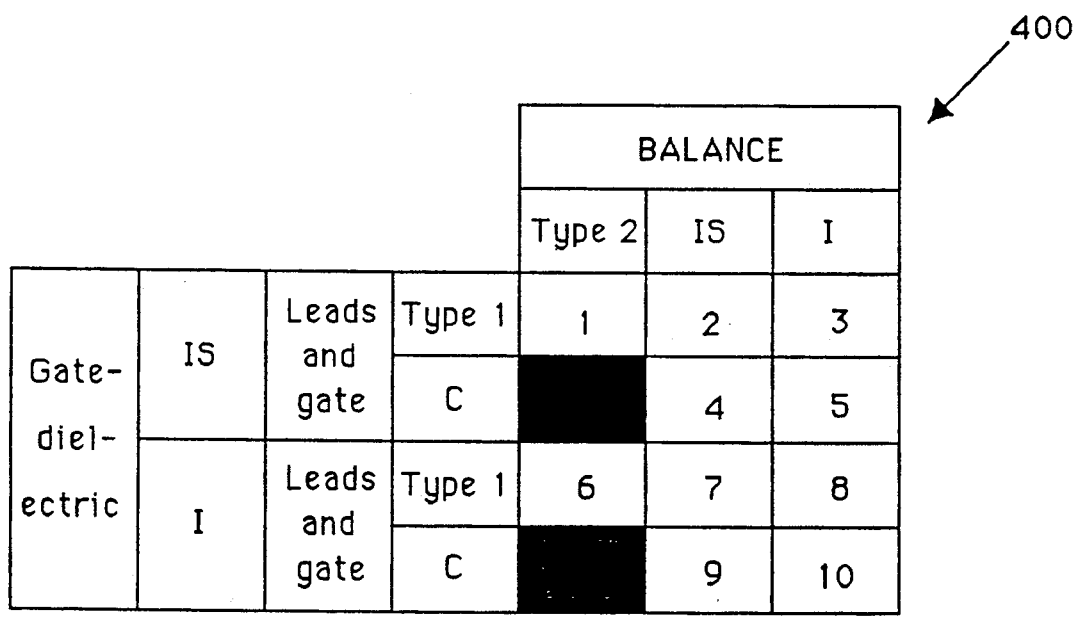
FIG. 17 illustrates ten structural options for a monocrystalline 3-D MOSFET.

FIG. 17 illustrates a tabular array 400 of structural options that apply in fabricating the 3-D MOSFET of FIG. 16. The term "balance" at the top of the table refers to the material choices for the matrix surrounding the 3-D device and constituting the blance of the monolith. The three options listed are type-2 semiconuctor, insulating semiconductor (abbreviated IS), and insulator (abbreviated I), all monocrystalline. There are two options for the leads and gate electrode. They are type-1 semiconductor or conductor. These two options are listed twice because there are also two options for the gate dielectric, namely, insulating semiconductor and insulator. The viable options are identified in the boxes of the table that are numbered from one through ten. Two boxes are blacked out as nonviable because conductor regions as leads or interconnections do not reliably form blocking junctions with both semiconductor types and for both bias polarities. Thus there are ten options. A further option not noted in this table is that of making contact to the substrate region or letting it float electrically. Factoring in this option raises the total number of options to 20. The preferred embodiment when silicon is employed is option 6 (with the substrate-connection option being included), wherein type-1 semiconductor is heavily doped N-type silicon, and type-2 semiconductor is lightly doped P-type silicon. When materials in the GaAs family are employed, the preferred embodiment is option 1 (with the substrate-connection option being included), wherein type-1 semiconductor is heavily doped GaAs. and type-2 semiconductor is lightly doped P-type GaAs.

Figure 18:
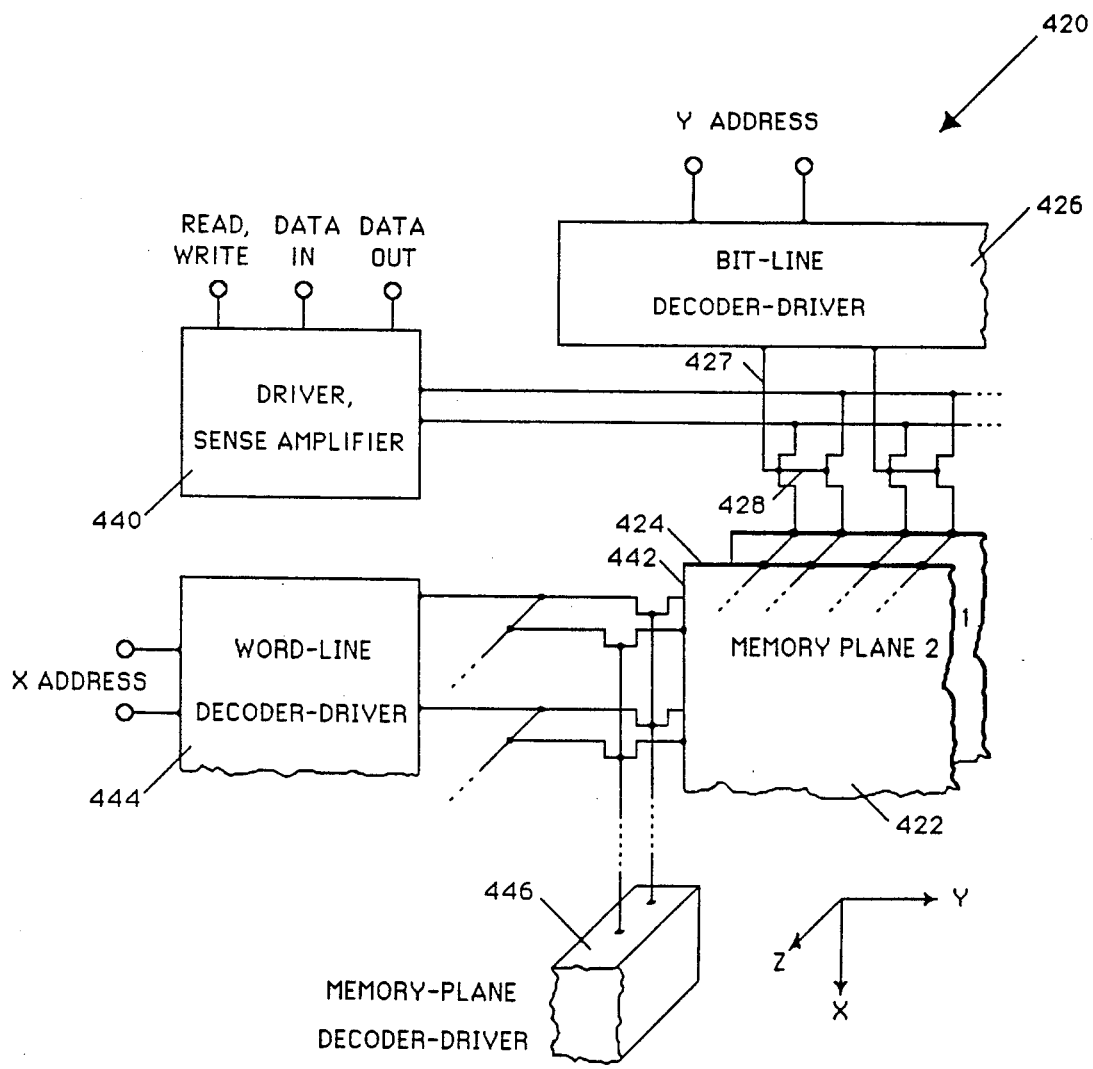
FIG. 18 illustrates the architecture of a 3-D memory.

FIG. 18 illustrates one possible architecture for a 3-D memory 420. The heart of the memory is an array of parallel memory planes, that number from one through n in the general case. It is a longstanding custom to let x and y represent axial directions in a memory plane, and this practice is perpetuated here, with the z direction proceeding from one plane to another. This practice does not necessarily conflict with our technological preference for letting the x axis be the crystal-growth direction, because the topological freedom of 3-D architecture will permit us to assign axis designations within the memory in any desired way. With repeated memory cells or storage sites located at the points of a space lattice, we may choose to let at least one of the primitive vectors that define the space lattice be nonorthogonal to the other two, so that each cell is located in a region of high-quality crystal growth.

Each memory plane, such as 442, has a series of connections along its edge 424 from a bit-line decoder-driver 426 through which the y-address function is accomplished. Each bit line, such as 427, drives a pair of gating devices, such as 428. The gating devices are represented here by a MOSFET symbol that is simplified but of self-evident meaning. Signals are sent through and received from one or the other of the gating-device pair by the driver and sense amplifier 440. An adjacent edge 442 of the same plane 442, has a series of connections from a word-line decoder-driver 444, through which the x-address fuction is accomplished. A gating device is positioned in each interconnection between the edge 442 and the word-line decoder-driver 444, and all of these gating devices for the plane 422 are controlled in parallel by a signal from a memory-plane decoder-driver 446 when the memory plane 422 is selected. Thus it is possible to write a one or a zero in any desired site of the 3-D memory array, and to read the content of any selected site as well.

In a preferred embodiment of the invention, each memory cell comprises an Eccles-Jordan latch of the kind implemented with JFETS in FIG. 4, using silicon 3-D JFETs. In another preferred embodiment, materials of the GaAs family are substituted for silicon. In both of these embodiments, the cross-coupled JFET driver devices have the configuration illustrated in FIG. 3. In another pair of preferred emdodiments using silicon and GaAs, respectively, each cross-coupling element in FIG. 3 is converted from gasket-like form to rod-like form to diminish parasitic capacitance, said rod emerging through a hole in the top of the isolating box and having a flange that accomplishes orthogonal isolation against the top box.

In another preferred embodiment of the invention, the JFETs of the latch in FIG. 4 are replaced by 3-D MOSFETs of the kind shown in FIG. 16. When silicon is used, option 6 of FIG. 17 is selected. When materials from the GaAs family are used, option 1 of FIG. 17 is selected.

Figure 19:
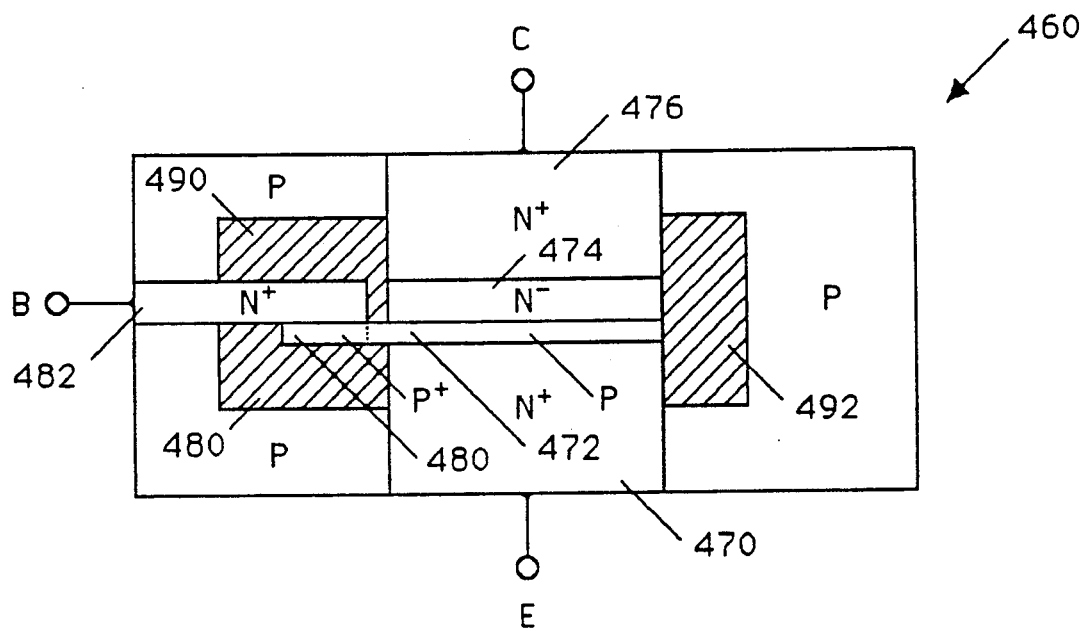
FIG. 19 illustrates an insulator-isolated 3-D BJT.
Figure 19:
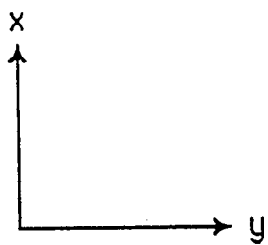

FIG. 19 illustrates in cross-sectional representation a monocrystalline lattice-matched 3-D BJT, or bipolar junction transistor, 460 buried within a largely P-type semiconductor monolith. The device comprises semiconductor and insulator regions. It incorporates an N+ emitter region 470, a thin P-type base region 472, an N− collector region 474, adjacent to said base region, and an N+ collector region 476 adjacent to said N− collector region. A P+ region 480 makes ohmic contact to the P-type base region 472 and to the N+ base lead 482. Isolation of the BJT 470 is accomplished by surrounding but localized insulator region shown in the cross-sectional representation as regions 490, 492, and 494.

In a preferred embodiment of the invention, BJTs having substantially the structure 470 are employed in an Eccles-Jordan latch of well-known schematic configuration to realize a monocrystalline lattice-matched 3-D memory array. In another preferred embodiment of the invention, BJTs having substantially the structure 470 are employed to realize a monocrystalline lattice-matched digital logic circuit. In yet another preferred embodiment of the invention, BJTs having substantially the structure 470 are employed to realize a monocrystalline lattice-matched analog circuit.

Figure 20A:
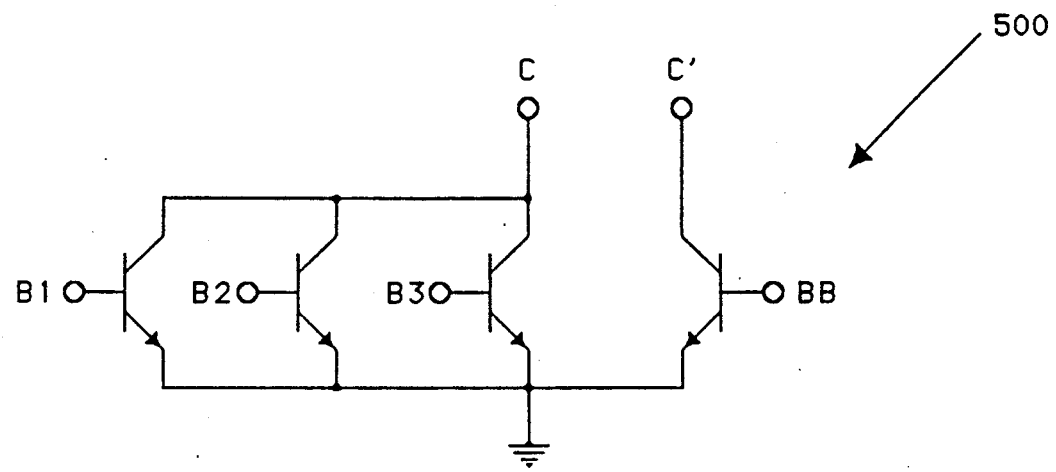
FIG. 20(a) illustrates schematically the central section of an ECL or CML logic-gate input stage.

FIG. 20(a) illustrates in schematic representation the central part of a prior-art ECL logic gate 500, comprising input transistors 502, 504, and 506. In a common-emitter connection to these BJTs is a reference BJT 508 whose base terminal 510 is connected to a stable, fixed voltage reference.

Figure 20B:
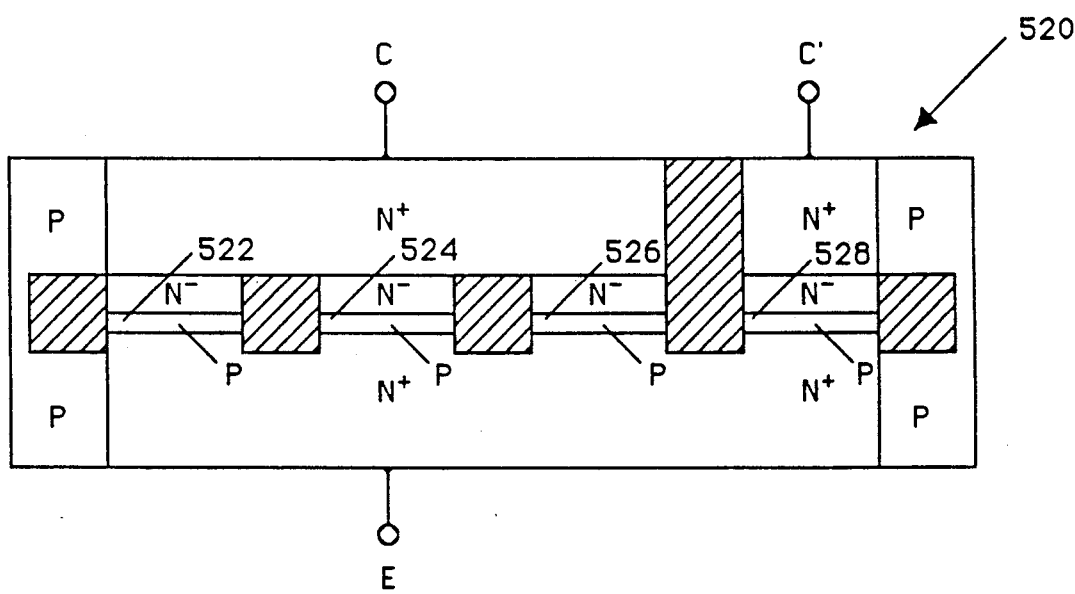
FIG. 20(b) illustrates a monocrystalline 3-D embodiment of the circuit of FIG. 20(a).

FIG. 20(b) illustrates in cross-sectional representation the central part of a monocrystalline lattice-matched 3-D ECL logic gate 520. Each of the four BJTs shown, 522, 524, 526, and 528, has substantially the structure of the BJT 460 in FIG. 19. The base leads of the four transistors emerge in the y direction, normal to the paper and out of the paper, so that in an x-y cross-sectional representation, each would resemble the BJT 460 in FIG. 19. In a preferred embodiment of the invention, the ECL logic gate 520 is used in a monocrystalline lattice-matched 3-D logic circuit.

Figure 21:
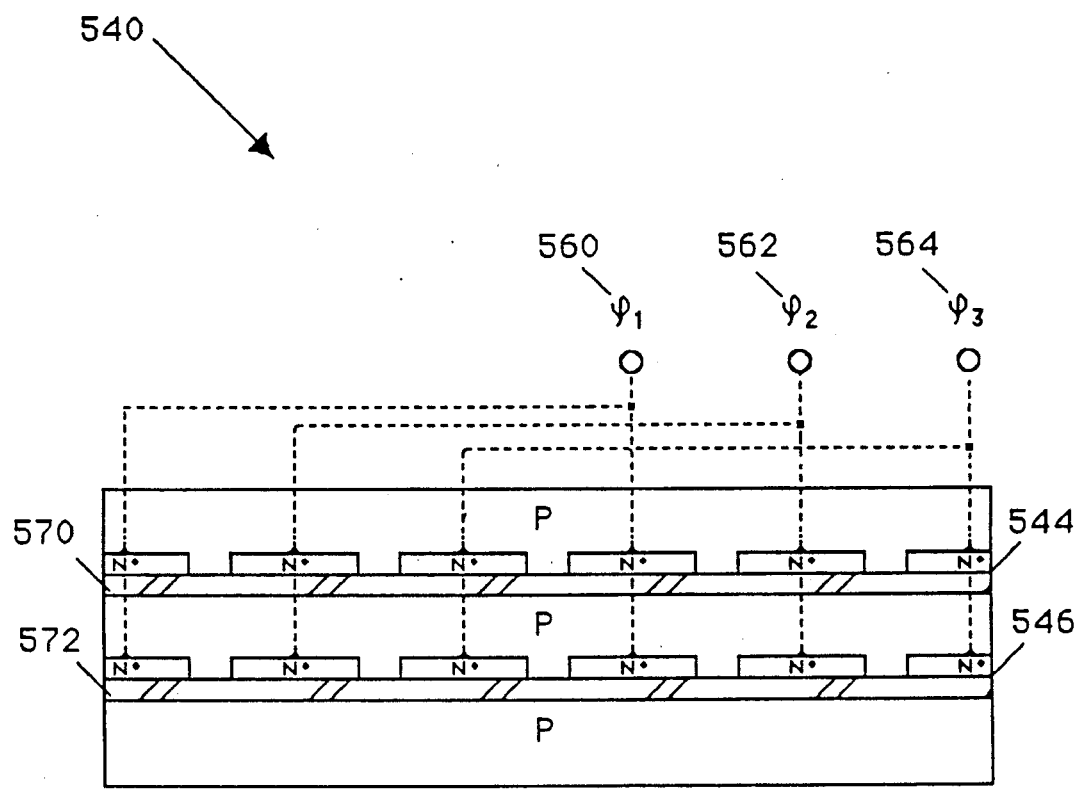
FIG. 21 illustrates one cross-sectional view of a 3-D array of charge-coupled devices.
Figure 21:
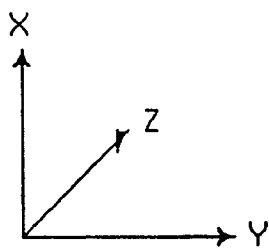

FIG. 21 illustrates in cross-sectional representation a portion of a self-isolating monocrystalline lattice-matched 3-D array of charge-coupled devices 540. Corresponding devices in each of the two or more successive layers 544 and 546 are connected in parallel to one of three clock phases, 560, or 562, or 564. The insulating regions 570 and 572 are continuous in the y direction but not in the z direction, which is into the paper.

Figure 22A:
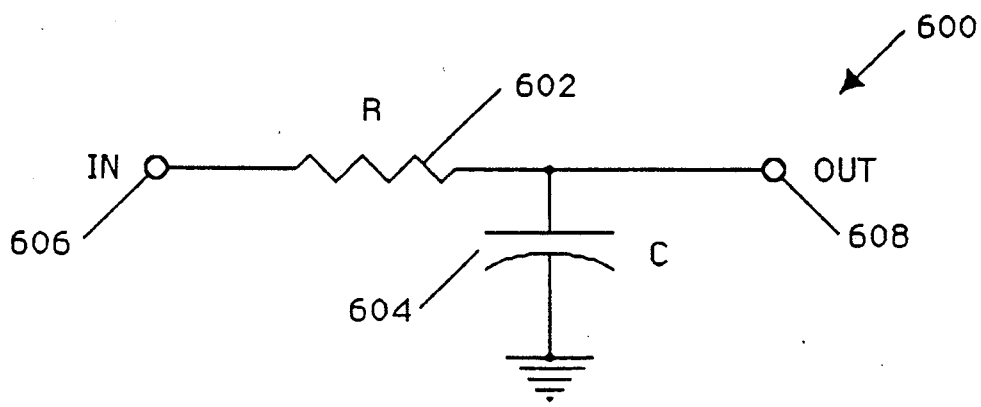
FIG. 22(a) illustrates schematically a resistor-capacitor integrating circuit.

FIG. 22(a) illustrates in schematic representation a prior-art integrating circuit 600, useful in analog circuits. It comprises a resistor R, 602, and a capacitor C, 604, and an input terminal 606, as well as an output terminal 608.

Figure 22B:
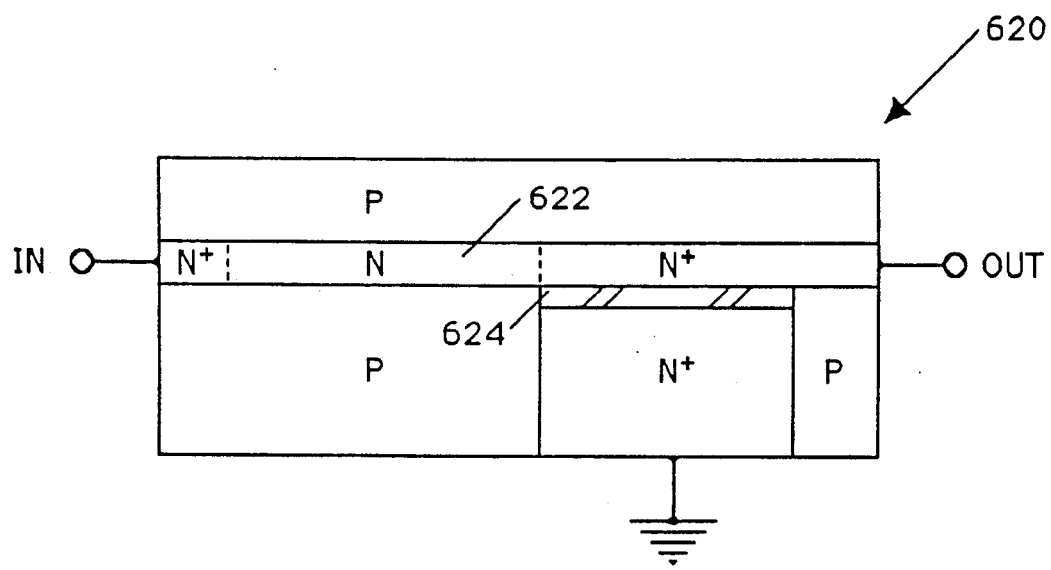
FIG. 22(b) illustrates a monocrystalline 3-D embodiment of the circuit of FIG. 22(a).

FIG. 22(b) illustrates in cross-sectional representation a self-isolating monocrystalline lattice-matched 3-D integrating circuit 620, having a resistor portion 622 and a capacitor portion 624 in the same schematic relationship to each other as in the circuit 600 of FIG. 22(a).

Figure 23A:
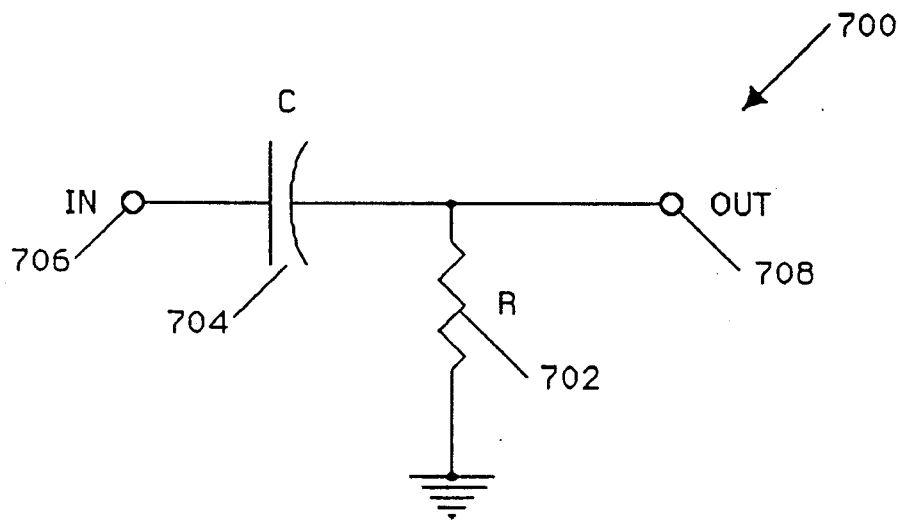
FIG. 23(a) illustrates schematically a resistor-capacitor differentiating circuit.

FIG. 23(a) illustrates in schematic representation a prior-art differentiating circuit 700, useful in analog circuits. It comprises a resistor R, 702, and a capacitor C, 704, and an input terminal 706, as well as an output terminal 708.

Figure 23B:
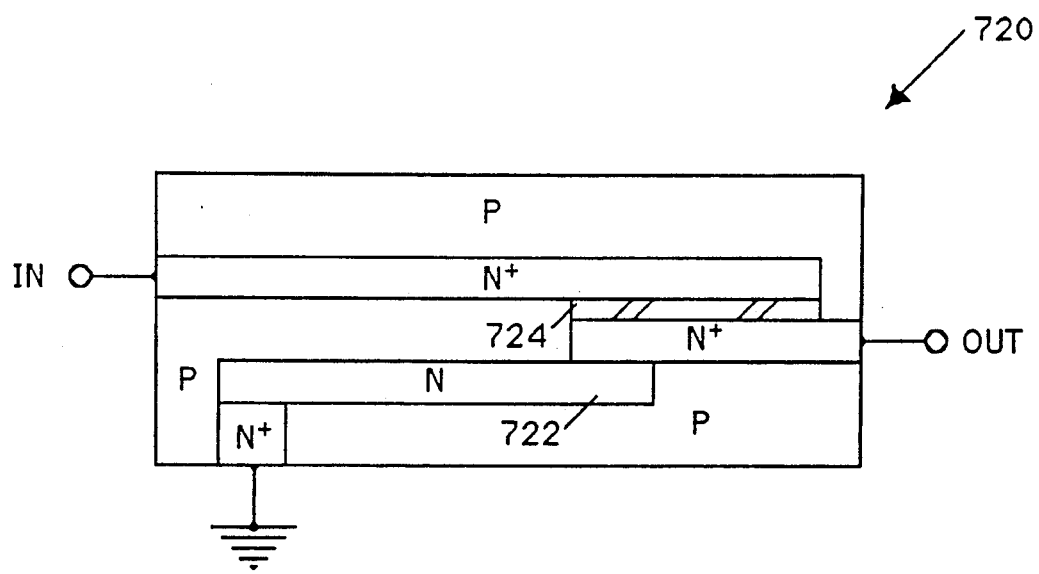
FIG. 23(b) illustrates a monocrystalline 3-D embodiment of the circuit of FIG. 23(a).

FIG. 23(b) illustrates in cross-sectional representation a self-isolating monocrystalline lattice-matched 3-D differentiating circuit 720, having a resistor portion 722 and a capacitor portion 724 in the same schematic relationship to each other as in the circuit 700 of FIG. 23(a).

Figure 24:
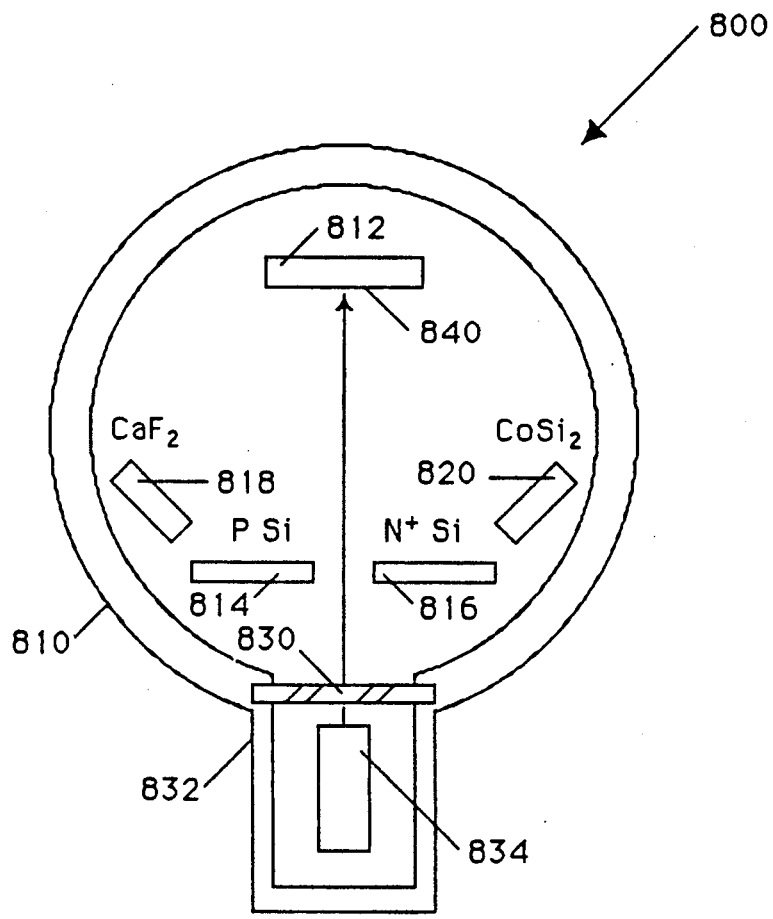
FIG. 24 illustrates a plan view of a chamber for crystal growth by sputter epitaxy, with light sources for patterning.

FIG. 24 illustrates in simplified plan-view cross-sectional representation an apparatus 800 for fabricating a monocrystalline lattice-matched 3-D integrated circuit. A sputtering chamber 810 contains a silicon substrate 812. It also contains a P-type silicon target 814 for growing the matrix of the integrated circuit. The heavily doped N-type silicon target 816 is used for growing conductors and conductive device portions. The calcium-fluoride target 818 is used for growing insulating regions of the monolith, and the cobalt-silicide target 820 is used for growing conducting regions of the monolith. Each of the targets 814, 816, 818, and 820 is equipped with a mechanical shutter not shown, to protect it when it is not in use. The window 830 is similarly protected. Inside the housing 832 is a multiple light source 834 that provides flashed and laser-beamed projected light that passes through the window 830, to strike the surface 840 of the substrate 812 in order to create desired patterns as the silicon crystal is grown. This apparatus 800 also permits the ion-milling process that is a part of the preferred method for fabricating a monocrystalline lattice-matched 3-D integrated circuit.

Figure 25:
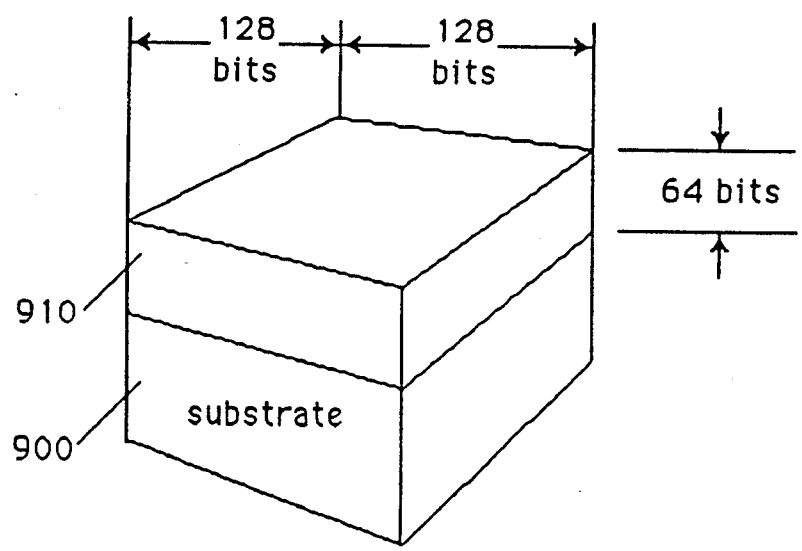
FIG. 25 illustrates a schematic three-dimensional view of a 1-megabit 3-D memory.

FIG. 25 illustrates in a preferred embodiment the organization of a 1-megabit 3-D memory, a preferred application, fabricated by the combination of sputter epitaxy and patterned light, a preferred method. Starting with a substrate 900, the active volume 910 of the memory is grown, comprising 64 layers of interconnected memory cells, each organized in an interconnected square array of 128 cells by 128 cells. The memory shown is one of 169 that have been grown in a 13 by 13 array on a 2-inch by 2-inch substrate.

MARKET CALCULATION

To illustrate the viability of the present invention, we shall determine the selling price of a preferred embodiment, a 1-megabit memory IC made at high volume by the sputter-epitaxy method of this invention. While this kind of economic projection obviously involves estimates and assumptions, its principles are straightforward. Furthermore, it can use well-known quantitative business data learned through experience in the semiconductor industry. [Business-data values used here were supplied by Dr. T. E. Hendrickson, but the estimates and assumptions are those of the inventors.]

A competitive semiconductor firm today has annual gross sales that amount approximately to 1.5 times its total capital investment. (In the hardest-fought market segment, the factor is about 1.0, and yet just a few years ago, it was 3.0 for the semiconductor industry broadly.) Total capital investment is typically 1.4 to 1.7 times the investment in equipment, with the balance being mainly buildings, and especially expensive clean-room space. Because of the relaxed clean-room needs of our process, we shall assume that the factor is 1.3 in our case. Thus our annual gross sales from one machine must amount to $(1.5) \times (1.3) = 1.95$ times the cost of the machine. To estimate the selling price of a single machine, mass produced at high volume, let us turn to the example of a larger and more complicated mass-produced machine. An automobile in the high-mid price range sells for $40,000. Let us assume that the selling price of the machine for quasicontinuous manufacture of 3-D integrated circuits is the same. Hence the product flowing from a single machine annually must have a selling price of $(\$40K) \times (1.95) = \$78K$.

The next step is to examine the output of a single machine. Let the memory have an organization of $128 \times 128 \times 64 = 1,048,576$ bits, as is shown in FIG. 25. Choose a memory-cell size of 30 $\mu$m $\times$ 30 $\mu$m $\times$ 4 $\mu$m. This is a loaded size, meaning that the volume of peripheral circuitry has been spread equally over the million memory cells. The active volume of the memory IC is therefore 3840 $\mu$m $\times$ 3840 $\mu$m $\times$ 256 $\mu$m (or in other terms, 151 mils $\times$ 151 mils $\times$ 10 mils). Choose a 13 $\times$ 13 array, for 169 memories per run. The active volume of the resulting sample is therefore 5 cm $\times$ 5 cm $\times$ 0.0256 cm (or about 2 in $\times$ 2 in $\times$ 0.01 in).

Sputter epitaxy can achieve a crystal-growth rate of 1 micrometer per minute. But because our crystal growth will be quasicontinuous, let us assume a growth rate of 0.2 $\mu$m/min. Hence the time required to grow 256 $\mu$m layer will be $$\left[ \frac{256 \ \mu m/run}{0.2 \ \mu m/min} \right] \times \left[ \frac{1 \ hr}{60 \ min} \right] = 21.33 \ hr/run.$$

The limiting total number of runs per year is thus $$\left[ \frac{24 \ hr/day}{21.33 \ hr/run} \right] \times \left[ \frac{365 \ day}{1 \ yr} \right] = 410 \ runs/yr.$$

Assuming a duty cycle of 73%, then this becomes 300 runs/yr. Hence the annual gross output of one machine is (300 runs/yr) $\times$ (169 IC/run), which amounts to 50,658 IC/yr. Because our process is contamination-free and under fully automatic control, let us assume a yield of 87%. Applying this factor to the gross output gives us 44,073 good IC/yr from one machine. Thus the selling price per IC becomes $$\left[ \frac{\$78,000/machine\text{-}yr}{44,073 \ good \ IC/machine\text{-}yr} \right] = \$1.77/IC.$$

This is a competitive price and will be reduced as evolutionary improvements in the 3-D design and the equipment manufacture are inevitably made. Even a relatively small firm with an equipment capitalization of $100M will require 2500 identical machines. The industry broadly will require many tens of thousands of machines, so that the economies of mass production will certainly be felt.

It may seem that making contact to, for example, the closely spaced vertical planes in the structure of FIG. 25 would pose unusual problems, but this is not so. Such contacts, whether internal or external, can have substantial lateral spacing. The line or curve along which the contacts are placed can be nonparallel to an edge of the memory. In the vicinity of a given contact, the adjacent planes (continuing with the same example) can be at some distance away vertically, and unaffected by the contact. This is yet another advantage of 3-D over 2-D structures. If it is desired to make all contacts on the top, similar arrangements are possible for contacts rising from horizontal planes.

Various modifications can be made to the present invention without departing from the scope thereof. The use of the term circuit singularly also extends to mean circuits in plural. While E-mode JFET has been used as an example, the principles also extend to D-mode JFET devices. Such an example, the E-mode JFET used as a level shifter could include a thicker channel for higher punch-through voltage where the thicker channel operates as a D-mode JFET.

Minor variations on the fabrication methods identified herein, and minor substitutions from the rapidly developing in-situ technology, as well as minor step-sequence variations can be made without departing from the scope and spirit of the invention. Also, the preferred embodiments are given as examples and should not be construed to be limiting.

What we claim is:

1. An electronic memory system comprising a three-dimensional array of memory cells within a monolith, said monolith being substantially monocrystalline and having parts that are substantially lattice-matched, and said array comprising at least one 3-D MOSFET.

2. Memory system of claim 1 wherein said MOSFET is a 3-D device of MOSFET-like topology having an inversion-layer channel.

3. Memory system of claim 1 wherein said MOSFET is a 3-D device of MOSFET-like topology having one or more quantum-well channels.

4. Memory system of claim 1 comprising at least one material from the following group:
   a. silicon;
   b. germanium;
   c. diamond;
   d. silicon carbide;
   e. aluminum antimonide;
   f. boron phosphide;
   g. gallium arsenide;
   h. gallium aluminum arsenide;
   i. gallium phosphide;
   j. indium phosphide;
   k. cadmium sulfide;
   l. cadmium selenide;
   m. cadmium telluride;
   n. zinc oxide;
   o. zinc sulfide;
   p. monocrystalline insulator; and,
   q. monocrystalline metal.

5. Memory system of claim 1 wherein at least one buried memory cell is directly connected only to other buried memory cells, and is not directly connected through a nodeless path to any surface of the monolith.

6. Memory system of claim 1 wherein parity checking along two intersecting paths permits the identification of a memory fault located at the cell where the intersection occurs.

7. Memory system of claim 1 wherein the memory cells are located at the points of a space lattice that is defined by three primitive vectors that are mutually orthogonal.

8. Memory system of claim 1 wherein the memory cells are located at the points of a space lattice that is defined by three primitive vectors, with at least one of said primitive vectors nonorthogonal to the other two.

9. Memory system of claim 1 wherein it is possible to transfer data simultaneously into a plane, or a rectangular field.

10. Memory system of claim 9 wherein the data transfer is accomplished optically.

11. Memory system of claim 1 wherein it is possible to transfer data simultaneously out of a plane, or a rectangular field.

12. Memory system of claim 11 wherein the data transfer is accomplished optically.

13. Memory system of claim 1 wherein it is possible to transfer data simultaneously into a plane, or a rectangular field, and possible to transfer data simultaneously out of another plane.

14. Memory system of claim 13 wherein the data transfer is accomplished optically.

15. Memory system of claim 1 wherein noise margins and logic swings are tailored to desired values by circuit-design methods.

16. An electronic digital logic system comprising a three-dimensional array of gates within a monolith, said monolith being substantially monocrystalline and having parts that are substantially lattice-matched, and said array comprising at least one 3-D MOSFET.

17. Digital logic system of claim 16 wherein said MOSFET is a 3-D device of MOSFET-like topology having an inversion-layer channel.

18. Digital logic system of claim 16 wherein said MOSFET is a 3-D device of MOSFET-like topology having one or more quantum-well channels.

19. Digital logic system of claim 16 comprising at least one material from the following group:
   a. silicon;
   b. germanium;
   c. diamond;
   d. silicon carbide;
   e. aluminum antimonide;
   f. boron phosphide;
   g. gallium arsenide;
   h. gallium aluminum arsenide;
   i. gallium phosphide;
   j. indium phosphide;
   k. cadmium sulfide;
   l. cadmium selenide;
   m. cadmium telluride;
   n. zinc oxide; and,
   o. zinc sulfide.
   p. monocrystalline insulator; and,
   q. monocrystalline metal.

20. Digital logic system of claim 16 wherein at least one buried logic gate is directly connected only to other buried logic gates, and is not directly connected through a nodeless path to any surface of the monolith.

21. Digital logic system of claim 16 wherein the logic gates are located at the points of a space lattice that is defined by three primitive vectors that are mutually orthogonal.

22. Digital logic system of claim 16 wherein the logic gates are located at the points of a space lattice that is defined by three primitive vectors, with at least one of said primitive vectors nonorthogonal to the other two.

23. Digital logic system of claim 16 wherein it is possible to transfer data simultaneously into a plane, or a rectangular field.

24. Digital logic system of claim 23 wherein the data transfer is accomplished optically.

25. Digital logic system of claim 16 wherein it is possible to transfer data simultaneously out of a plane, or a rectangular field.

26. Digital logic system of claim 25 wherein the data transfer is accomplished optically.

27. Digital logic system of claim 16 wherein it is possible to transfer data simultaneously into a plane, or a rectangular field, and possible to transfer data simultaneously out of another plane.

28. Digital logic system of claim 27 wherein the data transfer is accomplished optically.

29. Digital logic system of claim 16 wherein noise margins and logic swings are tailored to desired values by circuit-design methods.

30. Analog electronic system comprising a three-dimensional array of devices within a monolith, said monolith being substantially monocrystalline and having parts that are substantially lattice-matched, and said array comprising at least one 3-D MOSFET.

31. Analog electronic system of claim 30 wherein said MOSFET is a 3-D device of MOSFET-like topology having an inversion-layer channel.

32. Analog electronic system of claim 30 wherein said MOSFET is a 3-D device of MOSFET-like topology having one or more quantum-well channels.

33. Analog electronic system of claim 30 comprising at least one material from the following group:
   a. silicon;
   b. germanium;

c. diamond;
d. silicon carbide;
e. aluminum antimonide;
f. boron phosphide;
g. gallium arsenide;
h. gallium aluminum arsenide;
i. gallium phosphide;
j. indium phosphide;
k. cadmium sulfide;
l. cadmium selenide;
m. cadmium telluride;
n. zinc oxide; and,
o. zinc sulfide.
p. monocrystalline insulator; and,
q. monocrystalline metal.

34. Analog electronic system of claim 30 wherein at least one buried analog device is directly connected only to other buried analog devices, and is not directly connected through a nodeless path to any surface of the monolith.

35. Analog electronic system of claim 30 wherein it is possible to transfer data simultaneously into a plane, or a rectangular field.

36. Analog electronic system of claim 35 wherein the data transfer is accomplished optically.

37. Analog electronic system of claim 30 wherein it is possible to transfer data simultaneously out of a plane, or a rectangular field.

38. Analog electronic system of claim 37 wherein the data transfer is accomplished optically.

39. Analog electronic system of claim 30 wherein it is possible to transfer data simultaneously into a plane, or a rectangular field, and possible to transfer data simultaneously out of another plane.

40. Analog electronic system of claim 39 wherein the data transfer is accomplished optically.

41. An electronic system comprising a three-dimensional array of charge-coupled devices within a monolith that is substantially monocrystalline and whose parts are substantially lattice-matched, said array employing at least one material from the following group:
a. silicon;
b. germanium;
c. diamond;
d. silicon carbide;
e. aluminum antimonide;
f. boron phosphide;
g. gallium arsenide;
h. gallium aluminum arsenide;
i. gallium phosphide;
j. indium phosphide;
k. cadmium sulfide;
l. cadmium selenide;
m. cadmium telluride;
n. zinc oxide;
o. zinc sulfide;
p. monocrystalline insulator; and,
q. monocrystalline metal.

42. An electronic memory system comprising a three-dimensional array of memory cells within a monolith, said monolith being substantially monocrystalline and having parts that are substantially lattice-matched, and said array comprising at least one component from the following group in at least one of said memory cells;
a. an insulator-isolated 3-D BJT;
b. a junction-isolated 3-D BJT; and,
c. a merged FET.

43. An electronic digital logic system comprising a three-dimensional array of gates within a monolith, said monolith being substantially monocrystalline and having parts that are substantially lattice-matched, and said array comprising at least one component from the following group in at least one of said gates:
a. an insulator-isolated 3-D BJT;
b. a junction-isolated 3-D BJT; and,
c. a merged FET.

44. Analog electronic system comprising a three-dimensional array of devices within a monolith, said monolith being substantially monocrystalline and having parts that are substantially lattice-matched, and said array comprising at least one component from the following group in at least one of said gates;
a. an insulator-isolated 3-D BJT;
b. a junction-isolated 3-D BJT;
c. a merged FET;
d. a 3-D resistor-capacitor differentiating circuit; and,
e. a 3-D resistor-capacitor integrating circuit.

45. A 3-D MOSFET comprising
a substantially coplanar monocrystalline source and drain regions of a first conductivity type having edges nearest each other that are parallel and closely spaced;
b. a thin layer of insulator extending from one of said edges to the other;
c. a highly conductive, substantially monocrystalline gate region that is adjacent to the layer of insulator and that is matched to it in area, but that is spaced away from both source and drain regions by the layer of insulator;
d. a substantially monocrystalline lattice-matched matrix of a second conductivity type substantially surrounding the 3-D MOSFET, providing the isolation that permits it to function in a 3-D integrated circuit;
e. highly conductive, substantially monocrystalline electrical leads of a first conductivity type making independent electrical connections to the source, drain, and gate regions, and extending from them in order to connect the 3-D MOSFET into a circuit;
f. a channel region connecting said source and drain regions and having a conductivity that is primarily controlled by gate-source voltage, and having conducting carriers that are primarily of the kind that are majority carriers in said source and drain regions; and,
g. all of said constituents combining to create a buried, substantially monocrystalline, substantially lattice-matched, 3-D MOSFET that is useful in 3-D integrated circuits.

46. A 3-D MOSFET comprising:
a. substantially coplanar monocrystalline source and drain regions of a first conductivity type formed in a substantially monocrystalline region of a second conductivity type, said source and drain regions having edges nearest each other that are parallel and closely spaced;
b. a thin layer of insulator extending from one of said edges to the other of said edges;
c. a highly conductive, substantially monocrystalline gate region that is adjacent to the layer of insulator and, that is spaced away from both source and drain regions by the layer of insulator;
d. a substantially monocrystalline lattice-matched matrix substantially surrounding the 3-D MOS- FET providing the isolation function in a 3-D integrated circuit;
e. highly conductive, substantially monocrystalline electrical leads making independent electrical connections to the source, drain, and gate regions, and extending therefrom in order to connect the 3-D MOSFET into a circuit;
f. a channel region connecting said source and drain regions and having a conductivity that is primarily controlled by gate-source voltage, and having conducting carriers that are primarily of the kind that are majority carriers in said source and drain regions; and,
g. all of said constituents combining to form a buried, substantially monocrystalline, substantially lattice-matched, 3-D MOSFET that is useful for use in 3-D integrated circuits.

47. An electronic system comprising a three-dimensional array of 3-D MOSFETs within a monolith that is substantially monocrystalline and whose parts are substantially lattice-matched, said array employing at least one material from the following group:
a. silicon;
b. germanium;
c. diamond;
d. silicon carbide;
e. aluminum antimonide;
f. boron phosphide;
g. gallium arsenide;
h. gallium aluminum arsenide;
i. gallium phosphide;
j. indium phosphide;
k. cadmium sulfide;
l. cadmium selenide;
m. cadmium telluride;
n. zinc oxide;
o. zinc sulfide;
p. monocrystalline insulator; and,
q. monocrystalline metal.

48. An electronic system comprising a three-dimensional array of bipolar junction transistors within a monolith that is substantially monocrystalline and whose parts are substantially lattice-matched, said array employing at least one material from the following group:
a. silicon;
b. germanium;
c. diamond;
d. silicon carbide;
e. aluminum antimonide;
f. boron phosphide;
g. gallium arsenide;
h. gallium aluminum arsenide;
i. gallium phosphide;
j. indium phosphide;
k. cadmium sulfide;
l. cadmium selenide;
m. cadmium telluride;
n. zinc oxide;
o. zinc sulfide;
p. monocrystalline insulator; and,
q. monocrystalline metal.

49. An electronic system comprising a three-dimensional array of merged field-effect transistors within a monolith that is substantially monocrystalline and whose parts are substantially lattice-matched, said array of employing at least one material from the following group:
a. silicon;
b. germanium;
c. diamond;
d. silicon carbide;
e. aluminum antimonide;
f. boron phosphide;
g. gallium arsenide;
h. gallium aluminum arsenide;
i. gallium phosphide;
j. indium phosphide;
k. cadmium sulfide;
l. cadmium selenide;
m. cadmium telluride;
n. zinc oxide;
o. zinc sulfide;
p. monocrystalline insulator; and,
q. monocrystalline metal.

* * * * *